(12) United States Patent
Gunaratne et al.

(10) Patent No.: US 9,957,157 B2
(45) Date of Patent: May 1, 2018

(54) FABRICATION OF SELF ASSEMBLING NANO-STRUCTURES

(75) Inventors: Gemunu H. Gunaratne, Houston, TX (US); Girish Nathan, Houston, TX (US); Donald J. Kouri, Richmond, TX (US); Pradeep Sharma, Sugar Land, TX (US); Fazle Hussain, Houston, TX (US); Feng Shi, Houston, TX (US)

(73) Assignee: University of Houtson System, Houston, TX (US)

( * ) Notice: Subject to any disclaimer, the term of this patent is extended or adjusted under 35 U.S.C. 154(b) by 1663 days.

(21) Appl. No.: 11/857,967

(22) Filed: Sep. 19, 2007

(65) Prior Publication Data

US 2008/0075928 A1    Mar. 27, 2008

Related U.S. Application Data

(60) Provisional application No. 60/845,669, filed on Sep. 19, 2006.

(51) Int. Cl.
*B81C 1/00* (2006.01)
*B82Y 30/00* (2011.01)

(52) U.S. Cl.
CPC .......... *B81C 1/00031* (2013.01); *B82Y 30/00* (2013.01); *B81C 2201/0149* (2013.01); *Y10T 428/24628* (2015.01)

(58) Field of Classification Search
None
See application file for complete search history.

(56) References Cited

U.S. PATENT DOCUMENTS

| | | | | |
|---|---|---|---|---|
| 6,033,774 | A * | 3/2000 | Yitzchaik et al. | 428/333 |
| 6,232,066 | B1 * | 5/2001 | Felder | C40B 30/04 |
| | | | | 435/6.1 |
| 6,756,296 | B2 * | 6/2004 | Heath et al. | 438/622 |
| 2005/0176245 | A1 * | 8/2005 | Melechko | B01D 67/0062 |
| | | | | 438/672 |
| 2006/0134556 | A1 * | 6/2006 | Nealey et al. | 430/311 |

OTHER PUBLICATIONS http://www.sciencedirect.com/science?_ob=ArticleURL&_udi=B6TXW-49J8W07-1&_user=2502287&_coverDate=10%2F31%2F2003&_rdoc=1&_fmt=high&_orig=search&_origin=search&_sort=d&_docanchor=&view=c&_searchStrId=1524110113&_rerunOrigin=scholar.google&_acct=C000055109&_version=1&_urlVersion=0&_userid=2502287&md5=b906e0c3d91a6b22942293751c2f609f&searchtype=a.*
Himpsel, F.J. et al. "Self assembly of one-dimensional nanostructures at silicon surfaces". Solid State Communications 117 (2001) 149-157.*

* cited by examiner

*Primary Examiner* — Bruce H Hess
*Assistant Examiner* — Sathavaram I Reddy
(74) *Attorney, Agent, or Firm* — Robert W Strozier

(57) ABSTRACT

A new approach to fabricating regularly patterned nano-scale structures, by self assembly of the structures is disclosed, where a pattern of nano-lines are deposited on a substrate and nano-structures are grown by self assembly in regions between the lines to form regular or patterned nano-scale structures, which are ideally suited for the construction nano-scale materials, nano-scale electronic devices and other nano-scale objects, apparatuses or devices. The invention also relates to methods of making and using same.

16 Claims, 21 Drawing Sheets

Directed Assembly

Directed Assembly

FIG. 11A
$I_d=0.0$
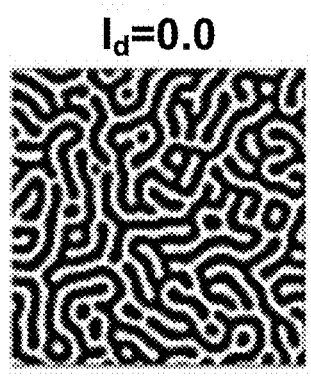
FIG. 11B
$I_d=0.2$
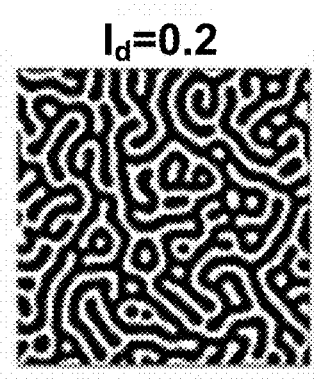
$I_d=0.6$
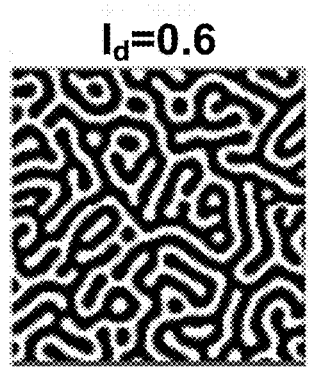
$I_d=1.0$
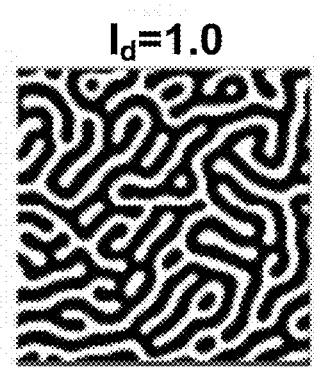
FIG. 11C
FIG. 11D

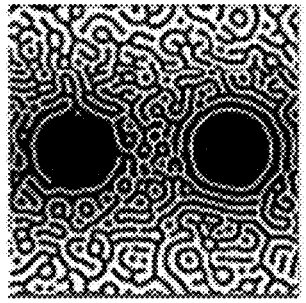 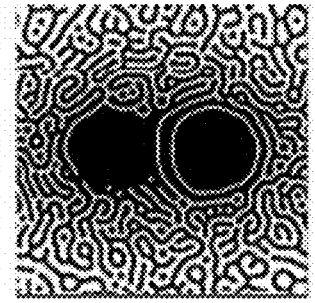 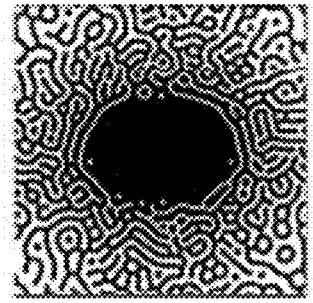
FIG. 18A     FIG. 18B     FIG. 18C
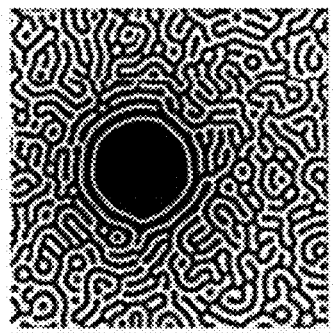 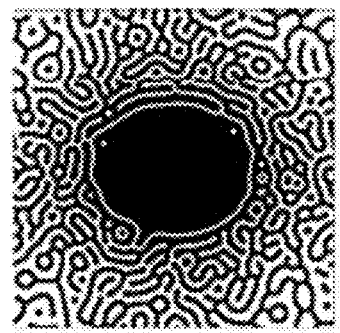
FIG. 19A     FIG. 19B
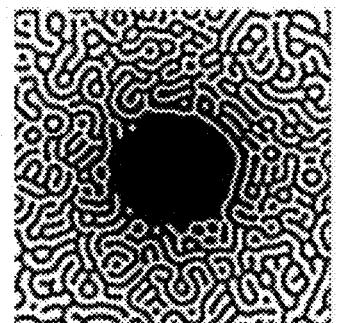 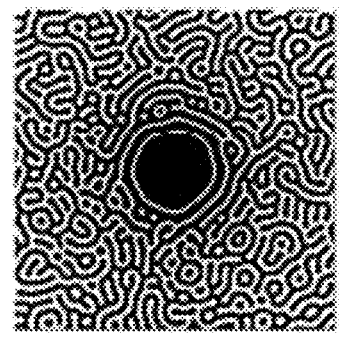
FIG. 19C     FIG. 19D

FABRICATION OF SELF ASSEMBLING NANO-STRUCTURES

RELATED APPLICATIONS

This application claims priority to U.S. Provisional Patent Application Ser. No. 60/845,669, filed 19 Sep. 2006 (Sep. 19, 2006).

GOVERNMENTAL INTEREST

Governmental entities may have certain rights in and to the contents of this application due to funded from the National Science Foundation through grants DMS-0607345 (GHG), CMMI-0709293 (GHG), and Office Naval Research Aware N000140510662 (PS), and a grant from the Texas Center for Superconductivity at the University of Houston (GHG and PS).

BACKGROUND OF THE INVENTION

1. Field of the Invention

The present invention relates to a new approach to fabricating regularly patterned structures at a nano-scale level, by self assembly of the structures and for methods of making and using same.

More particularly, the present invention relates to a new approach to fabricating regularly patterned nano-scale structures, by self assembly of the structures, where a pattern of nano-lines are deposited on a substrate and nano-structures are grown by self assembly in regions between the lines to form regular or patterned nano-scale structures, which are ideally suited for the construction nano-scale materials, nano-scale electronic devices and other nano-scale objects, apparatuses or devices. The invention also relates to methods of making and using same.

2. Description of the Related Art

The description of the prior art can be found in the detailed description of the invention section.

Although many methods and systems have been disclosed in the open and patent literatures, there is still a need in the art for improved fabrication methodologies for preparing regular or patterned nano-scale structures.

SUMMARY OF THE INVENTION

The present invention provides a composition comprising a uniformly patterned surface including a plurality of nano-lines deposited on the surface of the composition forming regions between the lines. The composition also includes self-assembled nano-scale structures formed in the regions, where a line spacing, a line thickness and a line height are adjusted so that the self-assembly of the nano-scale structures occurs in such a way as to produce well ordered or substantially defect free patterned self-assembled nano-structures within or on the regions. The term well ordered or substantially defect free means that the pattern has at least 90% pattern uniformity, where 100% pattern uniformity means that the pattern is without defect. In certain embodiments, well ordered or substantially defect free means that the pattern has at least 95% pattern uniformity. In certain embodiments, well ordered or substantially defect free means that the pattern has at least 97% pattern uniformity. In certain embodiments, well ordered or substantially defect free means that the pattern has at least 99% pattern uniformity. In certain embodiments, well ordered or substantially defect free means that the pattern has at least 99.9% pattern uniformity.

The present invention also provides a method for forming patterned surfaces including the steps of forming a plurality of lines on a surface of a substrate forming regions between the lines, where a line spacing, a line thickness and a line height are adjusted to support self-assembly nano-structure formation to produce well ordered or substantially defect free patterned self-assembled nano-structures within or on the regions. After the pattern is formed, the pattern substrate surface is treated with a composition sufficient to self-assemble nano-structures within the regions, where the lines force the self-assembly to proceed in such as way that the nano-structures are well ordered or substantially defect free patterns within or on the regions. The method can also include additional line forming and treating steps to form a plurality of different patterns and a plurality of different nano-structures within the different patterns, where the number of regions can be the same or different and the ordering of the patterns can be the same or different. Thus, the patterns can all be well ordered or substantially defect free. In certain embodiments, the one pattern can be substantially defect free and the other patterns can be partially ordered or partially defect free or not well ordered or substantially defect free—unordered and with any degree of defected. The term partially ordered or partially defect free means that the pattern has pattern uniformity between about 10% and about 90% pattern uniformity. In certain embodiments, partially ordered or partially defect free means that the pattern has pattern uniformity between about 10% and about 95% pattern uniformity. In certain embodiments, partially ordered or partially defect free means that the pattern has pattern uniformity between about 10% and about 97% pattern uniformity. In certain embodiments, partially ordered or partially defect free means that the pattern has pattern uniformity between about 10% and about 99% pattern uniformity. These definitions for partially ordered are designed to trace the well ordered or substantially defect free definition as any thing that is not well ordered or substantially defect free and not well ordered is considered partially ordered.

The present invention also provides a surface including a plurality of regions defined by a plurality of lines and a plurality of self-assembled nano-structures within or on each region, where the nano-structures are well ordered or substantially defect free within or on each region.

The present invention also provides a surface including a plurality of first regions defined by a plurality of first lines and a plurality of first self-assembled nano-structures within or on each first region, where the first nano-structures form a first pattern within or on each first region that is well ordered or substantially defect free. The surface also includes a plurality of second regions defined by a plurality of second lines and a plurality of second self-assembled nano-structures within or on each second region, where the second nano-structures form a second pattern within or on each first region that is not well ordered or substantially defect free, where the pluralities are the same or different.

The present invention also provides a surface including a plurality of first regions defined by a plurality of first lines and a plurality of first self-assembled nano-structures within or on each first region, where the first nano-structures form a first pattern within or on each first region that is well ordered or substantially defect free. The surface also includes a plurality of second regions defined by a plurality of second lines and a plurality of second self-assembled nano-structures within or on each second region, where the second nano-structures form a second pattern within or on each first region that is partially ordered or partially defect free. The surface also includes a plurality of third regions defined by a plurality of third lines and a plurality of third self-assembled nano-structures within or on each third region, where the third nano-structures form a third pattern within or on each third region that is not well ordered or substantially defect free, where the pluralities are the same of different. Of course, it should be recognized that the surface can include more than three patterns with regions containing different nano-structures with differing order requirements.

BRIEF DESCRIPTION OF THE DRAWINGS

The invention can be better understood with reference to the following detailed description together with the appended illustrative drawings in which like elements are numbered the same:

FIGS. 11A-D depict the effect of a nonzero Id is shown on a system with average concentration $C_0=0.5$, where the values of $l_d$ are as indicated in the figure showing an increase in pattern wavelength size with $l_d$.

FIGS. 18A-C depict sequence of patterns for $l_d=0.5$, $C_0=0.5$, L=512, and time T=95000, where from left to right, the spacing between the defects is 272, 192, and 112 and this spacing is measured in units of the lattice spacing.

FIGS. 19A-D depict sequence of patterns for $l_d=0.5$, $C_0=0.5$, L=512, and time T=95000, where the pattern shows a single defect placed at 210 (top left), two defects at separation 92 (top right), two defects at separation 52 (bottom left), and two defects at a separation 12 (bottom right).

DETAILED DESCRIPTION OF THE INVENTION

Figure 1A:
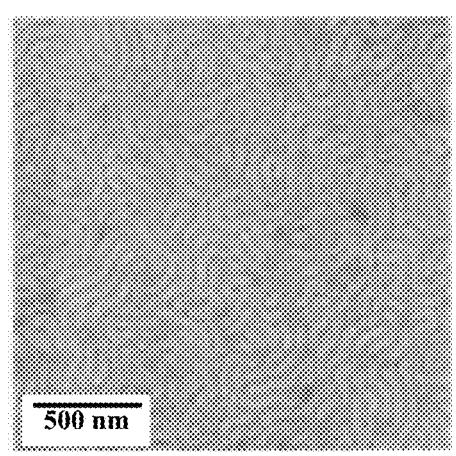
FIGS. 1A-C depicts lithographically induced self-assembly of diblock copolymers on patterned substrates by Paul Nealey and collaborators—the left panel shows labyrinthine patterns that result when the substrate is not patterned, while the right panel shows the lithographically induced self-assembly of the polymers into periodic stripes of wavelength—50 nm.

The inventors have found that large arrays of nano-scale structures can be formed on a substrate by first forming a pattern of guiding lines having a certain thickness, height and spacing so that within regions formed between the lines, nano-structures can be self-assembled using standard monolayer or multi-layer self-assembly techniques.

Overview of Guiding the Growth of Uniform Small Scale (~10 nm) Arrays

Nano-scale arrays are useful for many technologically important applications including the construction of giant magneto-resistance devices and CMOS circuits (Barry et al, Proc. of The Foundations of Nanoscience, Utah, 2004), ultrahigh density magnetic data storage (Ross et. al, Adv. Materials, 15, 1599 (2003)) and nano-scale lasers using arrays of quantum dots. However, these structures have to be regular on a large scale, because any spatial size variations and disrupted long-range order leads to undesirable inhomogeniety in electromagnetic and optical properties. We report on a technique to construct such large arrays.

Lithographic techniques are the state-of-the-art in construction of large uniform arrays. It is an extremely slow process, and the smallest sizes achieved currently are ~50-100 nm. Recently, there has been a considerable effort in guiding patterns in epitaxial growth. Among its advantages is a significant reduction in the time needed for construction. Even more significantly, the scale of the patterns is less than or order of 10 nm. For example, Kern et. al. (PRL, 67, 855 (1991)) reported the spontaneous formation of Cu—O Islands on an Cu(110) substrate. Pohl et al. (Nature, 397, 238(1999)) found that depositing Sulphur atoms on a Silver-Ruthenium epilayer led hexagonal structure of Sulphur atoms. In both cases, the reported wavelength of these structures was of the order of a few nanometers. Hence epitaxial techniques can provide an increase in density of ~100 over lithographic etching. However, such self-assembled—or spontaneously formed—patterns exhibit inhomogeneity on a large scale.

There have been several attempts to guide the formation of large uniform arrays in self-assembly. One such attempt was the use of a few lithographic "lines" to guide the self-assembly in magnetic block co-polymers (Ross et. al., Adv. Materials, 15, 1599 (2003)). The basic idea here is to break the symmetry of the underlying system by etching lines at a scale of about 100 nm in order to force the self-assembly in a preferable direction. Although this did increase the scale of regular arrays, it is still insufficient from a technological standpoint.

Our approach, as opposed to breaking the symmetry of the underlying system, is to break the symmetry of the initial conditions. Specifically, we "mask" the deposition by placing a comb of parallel stripes of width ~100 nm in front of the surface, and thus impose a preferred direction for the growth of the array. We find that it is possible to get as large a uniform array as we wish using this technique. The figure shows an example of a large uniform array so constructed and one that is grown without the mask (top). FIG. 8 of the document shows that we can generate as large an array as desired by increasing the noise in the initial state.

Suitable Reagents

Suitable substrates for use in this invention include, without limitation, dielectric material or insulator material such as polymer insulators, ceramic insulators, mineral insulators, crystal or crystalline insulators, etc., or mixtures or combinations thereof, semi-conductor materials including, without limitation, Group IV elemental semiconductors including diamond (C), silicon (Si), and germanium (Ge); Group IV compound semiconductors including silicon carbide (SiC) and silicon germanide (SiGe); Group III-V semiconductors including aluminium antimonide (AlSb), aluminium arsenide (AlAs), aluminium nitride (AlN), aluminium phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), and indium phosphide (InP); Group III-V ternary semiconductor alloys including aluminium gallium arsenide (AlGaAs, $Al_xGa_{1-x}As$), indium gallium arsenide (InGaAs, $In_xGa_{1-x}As$), aluminium indium arsenide (AlInAs), aluminium indium antimonide (AlInSb), gallium arsenide nitride (GaAsN), gallium arsenide phosphide (GaAsP), aluminium gallium nitride (AlGaN), aluminium gallium phosphide (AlGaP), indium gallium nitride (InGaN), indium arsenide antimonide (InAsSb), and indium gallium antimonide (InGaSb); Group III-V quaternary semiconductor alloys including aluminium gallium indium phosphide (AlGaInP, also InAlGaP, InGaAlP, AlInGaP), aluminium gallium arsenide phosphide (AlGaAsP), indium gallium arsenide phosphide (InGaAsP), aluminium indium arsenide phosphide (AlInAsP), aluminium gallium arsenide nitride (AlGaAsN), indium gallium arsenide nitride (InGaAsN), and indium aluminium arsenide nitride (InAlAsN); Group III-V quinary semiconductor alloys including gallium indium nitride arsenide antimonide (GaInNAsSb), Group II-VI semiconductors including cadmium selenide (CdSe), cadmium sulfide (CdS), cadmium telluride (CdTe), zinc oxide (ZnO), zinc selenide (ZnSe), zinc sulfide (ZnS), and zinc telluride (ZnTe); Group II-VI ternary alloy semiconductors including cadmium zinc telluride (CdZnTe, CZT), mercury cadmium telluride (HgCdTe), mercury zinc telluride (HgZnTe), and mercury zinc selenide (HgZnSe); Group I-VII semiconductors including cuprous chloride (CuCd);

Group IV-VI semiconductors including lead selenide (PbSe), lead sulfide (PbS), lead telluride (PbTe), tin sulfide (SnS), and tin telluride (SnTe); Group IV-VI ternary semiconductors including lead tin telluride (PbSnTe), thallium tin telluride ($Tl_2SnTe_5$), and thallium germanium telluride ($Tl_2GeTe_5$); Group V-VI semiconductors including bismuth telluride ($Bi_2Te_3$); Group II-V semiconductors including cadmium phosphide ($Cd_3P_2$), cadmium arsenide ($Cd_3As_2$), cadmium antimonide ($Cd_3Sb_2$), zinc phosphide ($Zn_3P_2$), zinc arsenide ($Zn_3As_2$), and zinc antimonide ($Zn_3Sb_2$); layered semiconductors including lead(II) iodide ($PbI_2$), molybdenum disulfide ($MoS_2$), gallium Selenide (GaSe), tin sulfide (SnS), and bismuth Sulfide ($Bi_2S_3$); Other semiconductors including copper indium gallium selenide (CIGS), platinum silicide (PtSi), bismuth(III) iodide ($BiI_3$), mercury (II) iodide ($HgI_2$), and thallium(I) bromide (TlBr); miscellaneous oxides semiconductors including titanium dioxide: anatase ($TiO_2$), copper(I) oxide ($Cu_2O$), copper(II) oxide (CuO), uranium dioxide ($UO_2$), uranium trioxide ($UO_3$); organic semiconductors, magnetic semiconductors, and mixtures or combinations thereof; metal substrates formed from any metal listed in the Periodic Table of elements and any other substrate suitable for receiving a pattern of lines or mixtures or combinations thereof. The term mixture means that the substrate is formed from a mixture of two or more of the above listed semiconductors. While, the term combination means that the substrate has areas composed of two or more different semiconductors list above. The inventors want to point out that this list is non-exhaustive and there may be insulators, semiconductors, metals or other substrates not listed that are presently known, and the inventors want to include all to be created insulators, semiconductors, metals or other substrates.

The line forming agents include, without limitation, any of the above listed materials that can be patterned onto a substrate. In certain embodiments, the line forming agent includes a Group VIII metal or ion, forming conductive lines. In other embodiments, the line forming agent includes metals to form semiconductor lines. In other embodiments, the line forming agent including materials to for insulator lines. Of course it should be recognized that the lines can be patterned on the surface and the lines can be composed of the same or different material.

Suitable nano-structures for use in this invention include, without limitation, any nano-scale molecular and/or atomic structure that is capable of self assembly such as organic molecules, oligomers, and/or polymers, biomolecular molecules, oligomer and/or polymers, nano-scale metal clusters (pure metals or alloys of two or more metals), fullerenes, nano-tubes, quantum dots, nano-shells (a core with a thin shell coating), or any other nano-scale molecular and/or atomic structure capable of self assembly or mixtures or combinations thereof.

Introduction

Here, we studied a model for nanoscale self-assembly of a monolayer on an elastic substrate. It was seen that hexagons, stripes, and inverted hexagons could be stabilized by varying the average concentration of one of the species, $C_0$. This phase diagram is generic to systems described by the competition of long- and short-range interactions (References here). We continue our study of nanoscale self-assembly in this chapter with two different points of focus: (1) Generation of large-scale perfect dot and stripe arrays for engineering applications, and (2) The influence of defects in the epilayer on patterns. For industrial applications, it is important that nanoscale patterns be regular since it is this feature that is of help in applications such as ultrahigh density data storage, ultrasmall LED devices, and for the manufacture of nanoelectronic circuits. The periodicity of nanoscale patterns on a large scale facilitates the programming of writing devices such as ion beams or S™ tips so that data can be read and written at high speed.

The current experimental techniques for self-assembly into ordered structures typically involve the tuning of the interactions between the constituents to induce order. Some common techniques are:

Electrostatically Induced Self-Assembly

This technique involves the dipping of a substrate into alternate solutions containing anionic and cationic material such as polymer complexes, metal and oxide nanoclusters, proteins, and other biomolecules. The electrostatic interactions between the components result in the formation of highly ordered arrays. This technique requires the careful choice of components and also a "tuning" of the interactions between them to induce self-assembly.

Lithographically Induced Self-Assembly

Figure 1B:
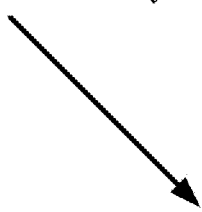
Figure 1B:
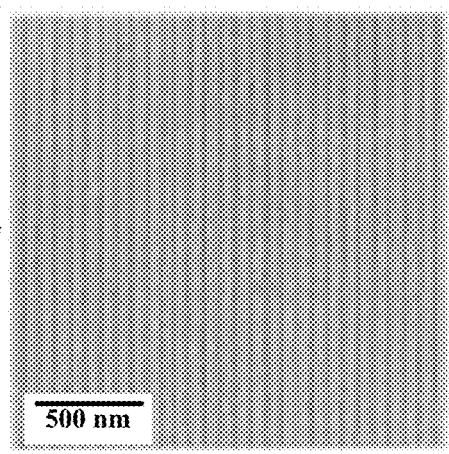
Figure 1C:
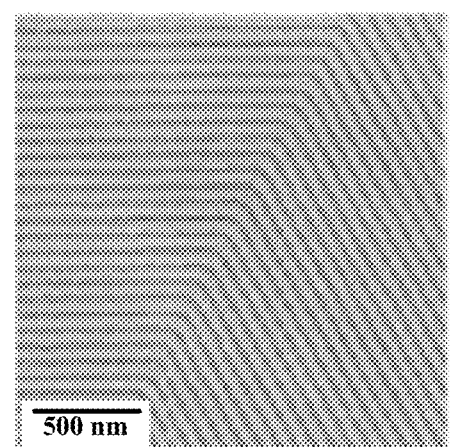

A relevant experiment in this regard was by Nealey et al., [1] where they used lithographically guided self-assembly to guide diblock copolymers into ordered stripe arrays. After chemically etching a pattern on the substrate, diblock copolymers were deposited that then arrange themselves to replicate the etched pattern. This yields periodic nanoscale arrays of stripes without any imperfections, as seen in FIGS. 1A-C below.

We introduce a new method for producing large-scale ordered patterns based on the use of external "masks". We show how the size of dots may be effectively tuned by changing $C_0$. FIGS. 1A-C depict lithographically induced self-assembly of diblock copolymers on patterned substrates by Paul Nealey and collaborators. The left panel shows labyrinthine patterns that result when the substrate is not patterned, while the right panel shows the lithographically induced self-assembly of the polymers into periodic stripes of wavelength—50 nm. This is of relevance in the signal-to-noise ratio considerations that arise in applications involving ultrahigh density data storage. The latter part of the chapter deals with the influence of defects on self-assembly. We discuss defects and modify the Suo-Lu equation to account for the effect of a point defect. The effect of a single defect on random and striped initial states is shown and it is seen that even a single defect can significantly alter the symmetry of observed patterns. Then we take up the problem of two interacting defects and compute the interaction force as function of their separation. It is seen that the force decays to zero for small separations, indicative of defect-defect screening.

The Method of Masks

The motivation is to produce ordered arrays of dots and stripes for nanoscale applications. Lithographic etching breaks the rotational invariance and continuous translational invariance of the underlying system. Unfortunately, the typical lengthscales associated cannot be much less than 50-100 nm (FIGS. 1A-C). We propose to use a set of special initial conditions in order to guide the surface growth towards large domains of periodic hexagonal arrays. In particular, the underlying substrate retains all its symmetries, and the initial state has broken symmetry.

Figure 2:
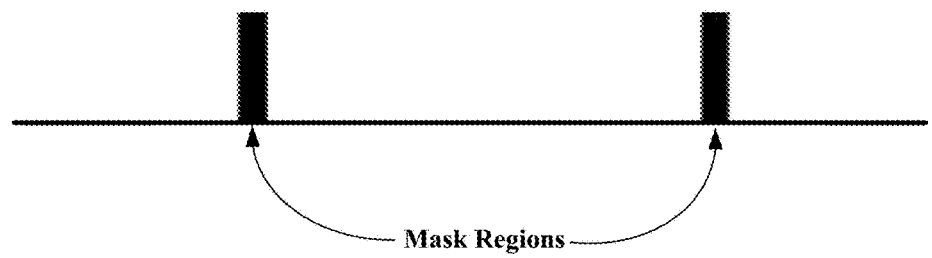
FIG. 2 depicts the initial state considered has 2 masks of width 15—the black regions correspond to regions directly below the mask lines, referred to in the text as mask regions.
Figure 3A:
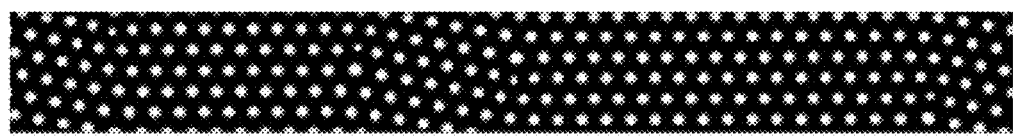
FIGS. 3A-D showing the final states without and with masks—from top to bottom: no mask, 1 mask of width 5, 2 masks of width 5, and 4 masks of width 5, showing long range order with the masks but only partial order without, where the time T=450000 for all contour plots.
Figure 3B:
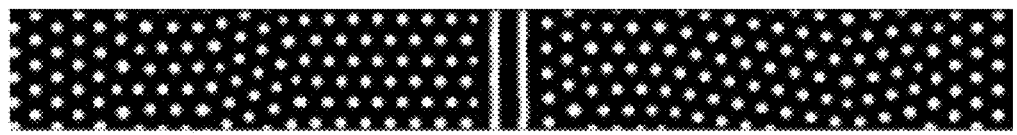
Figure 3C:
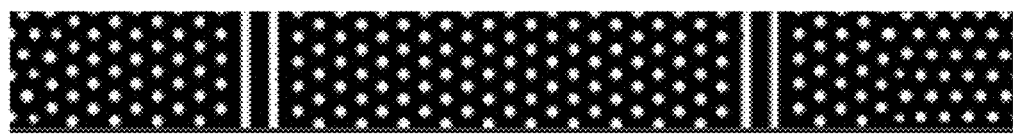
Figure 3D:
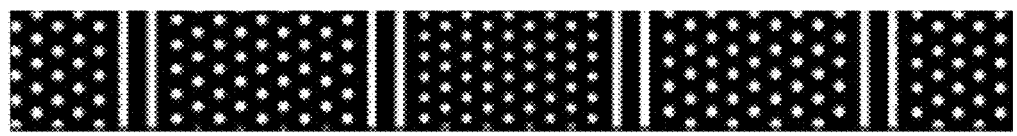
Figure 4A:
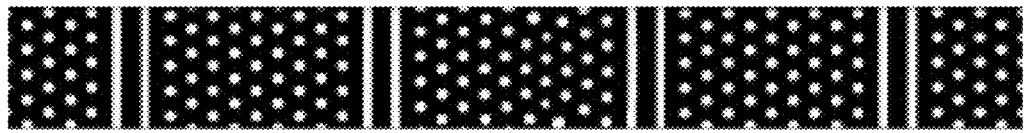
FIGS. 4A-D depict 4 masks of width 1 (Top), 5 (Second from top), 10 (Second from bottom), and 15 (Bottom) respectively. $C_0=0.35$ and the noise amplitude $\zeta=10^{-5}$.
Figure 4B:
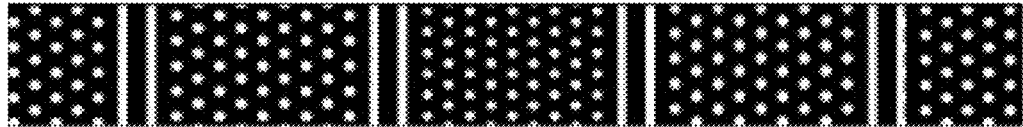
Figure 4C:
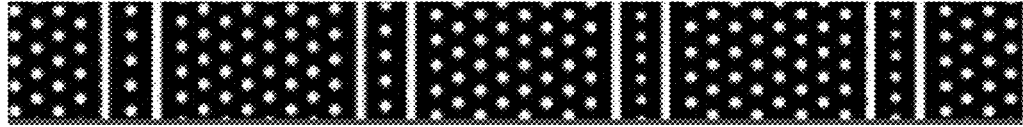
Figure 4D:
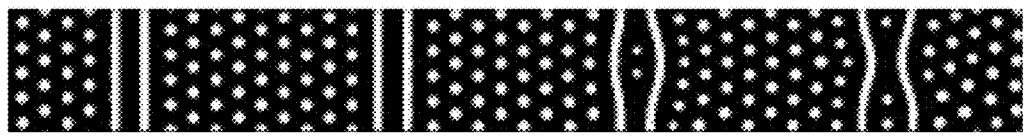
Figure 5A:
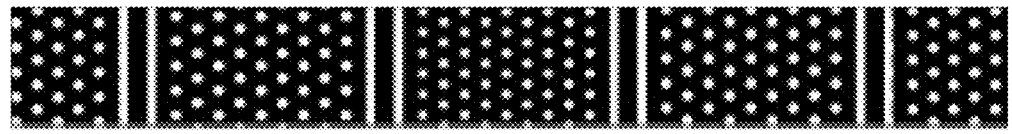
FIGS. 5A-D depict the final states, at T=450000, for four different initial conditions for 4 masks of width 5, where $C_0=0.35$ and $\zeta=10^{-5}$.
Figure 5B:
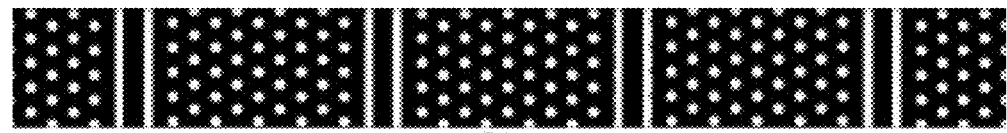
Figure 5C:
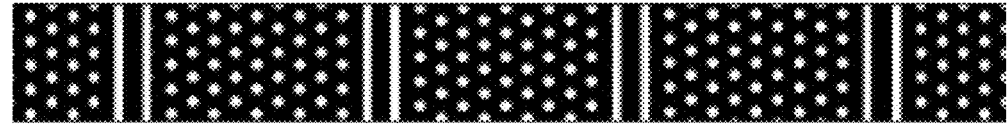
Figure 5D:
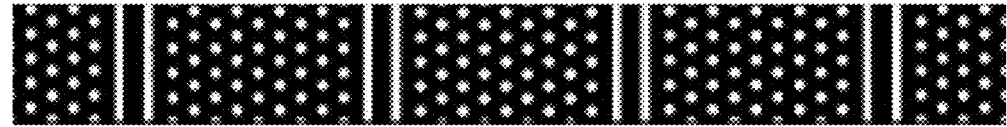
Figure 6A:
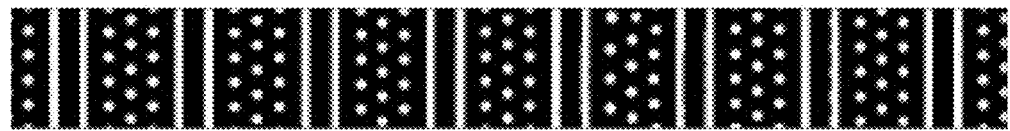
FIGS. 6A-D depict steady states at T=450000 for initial states with 8 masks, where the mask widths increase from top to bottom are 2, 5, 10, and 15, respectively, showing a clear the transition from a disordered states of bubbles and lines to perfect lines of bubbles or fully ordered bubbles.
Figure 6B:
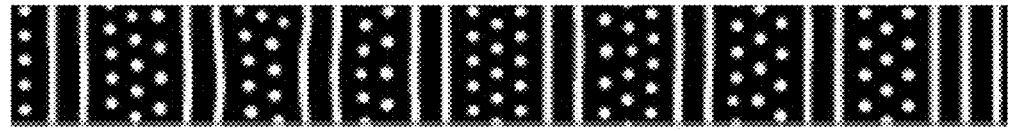
Figure 6C:
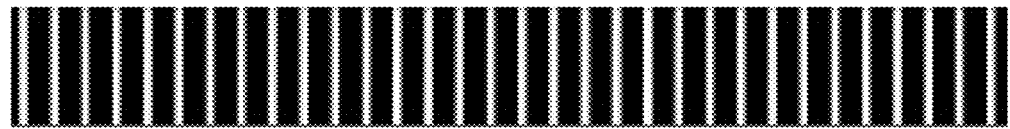
Figure 6D:
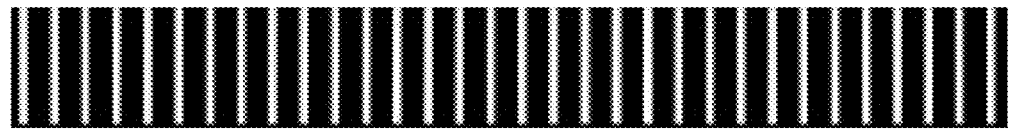

This symmetry breaking is achieved in the following way. Imagine an experiment where the source of atoms is an atomic oven. We place above the substrate but not in contact with it, a mask with lines of a certain thickness. It is assumed that the mask material is completely opaque to the atoms. On deposition, the initial concentration field has low values in the regions directly below the mask lines. A typical example is seen in FIG. 2 for a 64×512 lattice where we have 2 mask lines of width 15 each. Unless otherwise mentioned, all results shown in this section are for a 64×512 lattice. Co is the average concentration for the full substrate.

Suo and Lu [2, 3] considered the effect of seeding the initial random state with thin stripes, which then lead to steady-state patterns of aligned stripes. However, the kind of control required for their initial condition is much more stringent than what is presented here. Moreover, there was no systematic analysis done of the possible kinds of pattern tuning that could be done.

In FIGS. 3A-D, we show the comparison between an initial state with no mask and initial states using 1, 2, and 4 masks of width 5 each. We see that there is partial order in the no mask case but with the use of masks, the ordering of dots is much better. The average concentration for all contour plots in FIGS. 3A-D is set at $C_0=0.35$ and the noise amplitude $\zeta=10^{-5}$. The noise is delta-correlated in space and time.

The partial order seen in FIG. 3A-D for the case of no masks is of little use industrially, especially from the viewpoint of data storage. On the other hand, for the case of 2 and 4 masks, we see periodic dot arrays. While the ordered regions for the 4 mask case are around 120 units, the ordered region for the 2 masks case is almost 220 units. The dot arrays are separated by periodic line structures. Since the lines intervene periodically, any device that reads from or writes to such a device (assuming these dots are magnetic) may be easily programmed to "skip" the line regions. The lines are remnants of the initial condition and are centered around the initial mask positions. We refer to these in the remainder of this section as "Mask Remnants" (MRs). These MRs persist to very long times (numerical simulations till $\sim 10^6$ show no decay of these lines). They behave as artificial local boundary conditions. Due to this, the periodicity of the masks is an important issue. We have run numerical simulations for aperiodic masks and do not find long-range order. To study the effect of mask width on the dot arrays, we show in FIGS. 4A-D the results of increasing mask width on steady-state patterns.

It is seen that the increase in mask width has very little effect on the patterns. When the mask width is 15, we see that the patterns are slightly more disordered due to curvature of the MRs. Beyond this mask width, the patterns are not as highly ordered. The order depends on diffusion into the mask region and through it, and this is harder for larger widths.

FIGS. 5A-D show the final steady-states for the case of 4 masks of width 5 for 4 different initial conditions. The steady-state patterns bear a striking similarity, both in terms of the regions of the dots and also in terms of the dot sizes themselves. This is a necessary feature for the applicability of this technique to mass production of ordered arrays; every deposition happens under slightly different initial conditions and for the process to be practically useful, it is imperative that a large fraction of these initial conditions give very similar final patterns.

A natural question to ask is what happens for a very large number of initial mask lines. Given that the noise in the initial distribution is very small (as $\zeta=10^5$), we might expect that for a very large number of masks, the final states would be stripes and not dots, even though the average concentration is $C_0=0.35$ (a region of the phase diagram associated with partially ordered bubbles). The numerical results, shown in FIGS. 6A-D show the transition from a mixed state of disordered bubbles and lines to perfect lines as the mask width is increased.

With an increase in the number of mask lines, the initial state has a severely broken symmetry; however, for very small mask widths (2 and 5 in the figure), there is still enough cross-diffusion across the mask regions to induce disordered structures. With an increase in the mask width, this is smaller and the broken symmetry leads to the formation of perfect lines. We add that we have performed these simulations for lattices as large as 64×4096 and find the same result: for a sufficiently large number of masks and mask widths, the final steady states involve perfect lines. Such masks may be used to trigger a transition from the "expected" dot structures (for random initial states with no masks) to perfect lines (for random initial states with many masks). We have not studied the width of the lines and their separation in detail as yet, nor has any attempt been made so far to try and tune them.

To summarize, in this section, we showed how the introduction of masks leads to an initial symmetry breaking and results in ordered dot and stripe patterns. The presence of MRs requires careful placement of masks. It is of importance to see if one may achieve long-range order without any MRs. We show in the next section how this may be done.

Mask Initial States with Larger Initial Noise

Figure 7A:
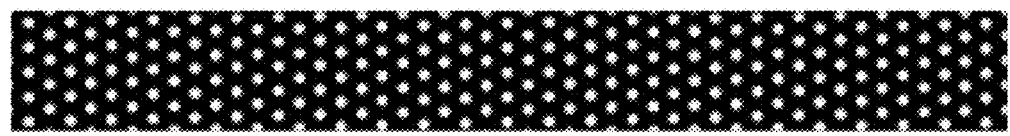
FIGS. 7A-C depict the noise amplitude $\zeta$ decreases from top to bottom: $\zeta=0.01$, 0.001, 0.0001 respectively, showing that for $\zeta=0.01$, a perfect array of dots without any defects is obtained.
Figure 7B:
Figure 7C:

We recall that so far, the noise amplitude $\zeta$ was fixed at 10–5. An increase in $\zeta$ will correspond to an effective larger diffusion constant initially; this would mean more transport across the mask regions and might result in the MRs not being able to form. From an experimental perspective, the larger values of $\zeta$ are more realistic since the noise amplitude corresponds to the fractions of monolayers that may be detected using say an STM. For very large values of $\zeta$, we do not expect any ordered patterns since the initial state is too disordered. In FIGS. 7A-C, we show the effect of changing (on the final state patterns. The initial conditions are $C_0=0.35$, and 8 masks of width 8.

Figure 8A:
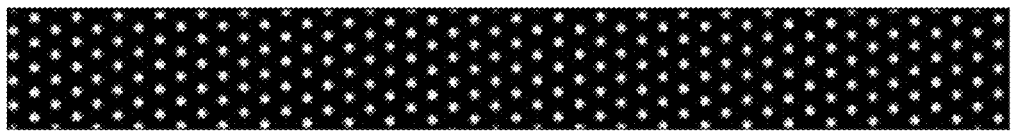
FIGS. 8A-C depict perfect dot arrays for $C_0=0.3$ ($\zeta=0.001$) (Top), $C_0=0.32$ ($=0.001$) (Middle), and $C_0=0.35$ ($\zeta=0.01$) (Bottom), where the pattern wavelength decreases with an increase in $C_0$ and all data are at time T=450000.
Figure 8B:
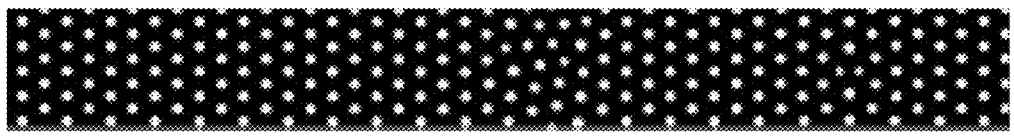
Figure 8C:
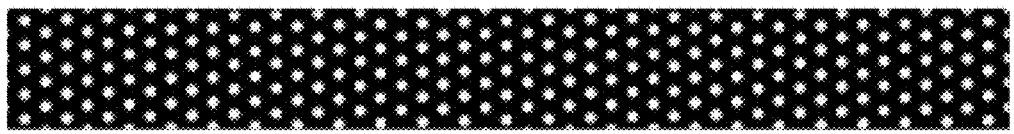
Figure 9A:
FIGS. 9A-D depict final patterns for 4 different initial condition for a 64×1024 lattice, where the dot arrays are typically of a size of ~700 units.
Figure 9B:
Figure 9C:
Figure 9D:

For the case of $\zeta=0.01$, the largest noise amplitude we consider in this study, we see a perfect dot array without any defects. The initial variation in the concentration helps to generate sufficient diffusion across the mask regions to avoid the formation of MRs. On the other hand, with a decrease in $\zeta$, this effect is smaller and perfect arrays are not seen. This enables us to generate perfect arrays efficiently. We now take up the problem of tuning dot sizes. This may be achieved by tuning the average concentration $C_0$ since $C_0$ directly impacts the pattern wavelength. In FIGS. 8A-C, we show the tuning of the size of dots.

It is emphasized that increasing $\zeta$ without masks produces only partial order. The introduction of the masks is therefore essential in imposing long-range ordered dot arrays. We have run simulations for the mask free case with $\zeta=0.01$, 0.001 to verify this. A caveat is in order. Although the increase of $\zeta$ has been used to produce perfect dot arrays and tune dot sizes, the increase in initial noise also leads to a larger variation in final state patterns between runs for small lattices. However, this effect may be mitigated by looking at larger lattices. In FIGS. 9A-D, we show for $C_0=0.35$ and $\zeta=0.01$ the steady states for a 64×10$^{24}$ lattice at time 450000. We observe that the ordered regions are very large (~700-750 units) and that the variation between runs is small.

To summarize, in this section, we showed how to generate perfect large scale dot arrays by increasing the initial noise in the distribution. This noise is more realistic when it comes to experiments and detection equipment such as STMs. The increase in ~ affords an increased diffusion across the mask regions and results in the absence of MRs. The dot sizes may be tuned by a change in $C_0$. This fact is important in the issue of signal-to-noise ratios that are pertinent for data storage and retrieval.

Defects in Self-Assembly

We define a defect to be a site that repels the species B. In experiment, this may be a foreign material. In the model, the concentration of B at this site (called $\vec{x}_0$) is assumed to take a small fixed value of 0.01. This concentration is fixed at every time step of the numerical simulation. For the present, we consider the case of frozen or immobile defects. The key approximation to calling a defect "frozen" is that the diffusion constant of the defect is much smaller than the rest of the epilayer.

Due to the addition of defects in the epilayer, the local non-uniformities in the concentration field become large. As a result, the higher order derivatives become important and Equation. (1) has to be modified to account for these. The inclusion of higher order derivatives of the free energy and the concentration field lead to the modified SL equation, as follows.

$$\frac{\partial C}{\partial t} = \frac{M}{\Lambda^2} \nabla^2 \left( \frac{\partial g}{\partial C} - 2h_0 \nabla^2 (1 - l_d^2 \nabla^2) C + \phi \varepsilon_{\beta\beta} \right) \quad (1)$$

Details of the derivation of this equation are in the Appendix. $l_d$ is a new length scale, called the defect length scale. Note that when $l_d=0$, Equation. (1) reduces to the original SL equation.

From an experimental perspective, $l_d$ may be changed in the following ways:

(1) A change in the material of the substrate will produce a change in $l_d$. Several candidate substrates are being tried out for the manufacture of nanoelectronic circuits (for e.g., nickel, cobalt, and copper) and this choice in substrate material gives a variation in $l_d$;

(2) A change in the lattice plane being used for deposition process or epitaxial growth will have an effect on $l_d$. For instance, the Cu {110} plane will in general have a different $l_d$ than the Cu {100} plane. This is also useful, although there might be a restriction in the pattern symmetries observed;

(3) Temperature control may also be used to modify $l_d$ since the domain boundary energy ($h_0$) is strongly dependent on temperature [5]. It is found [4] that the domain boundary free energy per unit length of domain, $\beta$, decreases with increasing temperature. $h_0$ also has a similar behavior. This means that if $\kappa_1$ and $\kappa_2$ are constant over the range of temperatures considered, $l_d$ increases with an increase in temperature. The question of whether the patterns formed are stable remains to be seen.

The dispersion relation (details in the Appendix) is, $$\sigma(q, Q) = -2q^2 \left( \frac{h_1}{2} - Qq + q^2 + l_d^2 q^4 \right) \quad (2)$$

Figure 10:
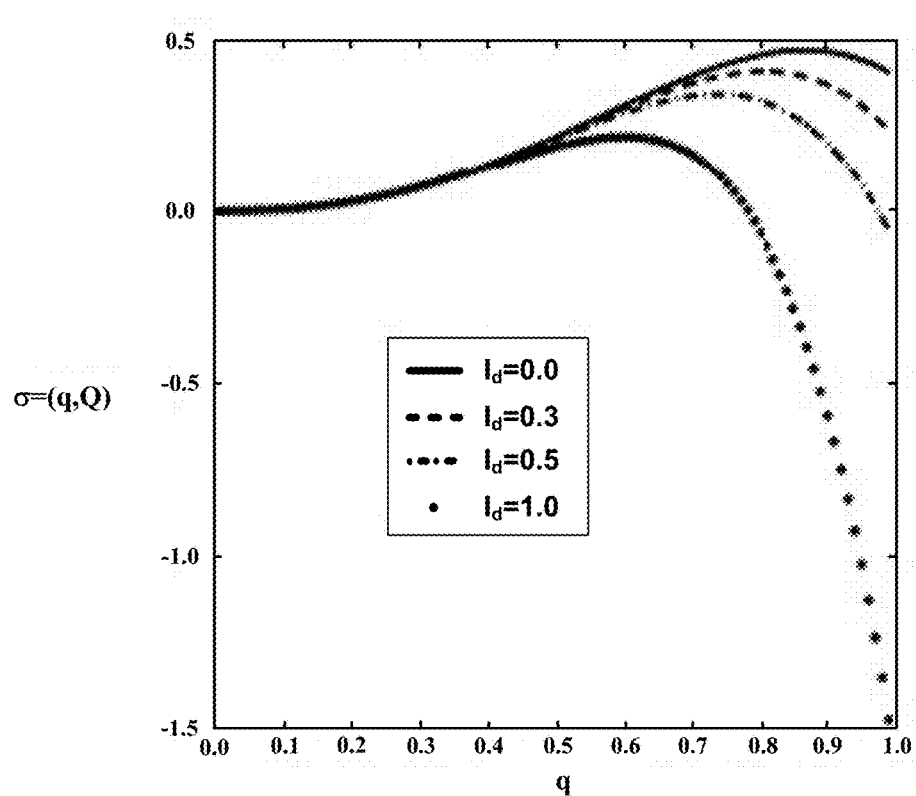
FIG. 10 depicts plot of the dispersion relation $\sigma(q,Q)$ versus q from Equation (2) for various values of $l_d$, where the shift in the peak value of q, $q_c$, to the left as $l_d$ is increased.

In FIG. 10, we show the effect of increasing $l_d$ on the dispersion relation when $C_0=0.5$. It is seen that with an increase in $l_d$, the most unstable wavenumber $q_c$, decreases; this in turn corresponds to an increase in the pattern wavelength $\lambda_c$, since $\lambda_c=2\pi/q_c$. Tuning $l_d$ leads to tuning the pattern wavelength in this way. FIG. 16 shows that the change in $q_c$, as $l_d$ is increased from 0 to 1 is from ~0.865 to ~0.61. This allows for a tuning of the wavelength in this range by about 30 percent.

FIGS. 11A-D corroborates the conclusions drawn from a study of the dispersion relation. We show steady state patterns for a 2562 lattice with average concentration $C_0=0.5$. There are no defects in this system. As $l_d$ is increased, the pattern wavelength increases in accordance with the predictions from the dispersion relation as shown in Equation. (2). This may be explained as follows. The surface stress term tends to minimize the elastic energy by minimizing the size of A and B domains. In contrast, the phase boundary term minimizes the energy by coarsening domains. This competition selects the feature size. The term involving the higher order derivatives and $l_d$ tends to coarsen the domains in order to reduce the curvature-energy. As a result, the new competition between the surface stress terms and the two phase coarsening terms gives rise to a larger pattern feature size; this increase in size is proportional to $l_d$ because $l_d$ underscores the relative importance of the phase boundary energy and the curvature energies.

Numerical Results I, A Single Defect on a Uniform Initial State

The initial random concentration has a mean value of $C_0=0.29$ and a spread of 0.001 about $C_0$. We choose the distribution to be delta-correlated noise. The spatial correlation length for the noise is one lattice unit. The results that follow are independent of the spread over a large range. The lattice size chosen is $512^2$. We place the defect at the center of the lattice. In the absence of defects, we expect bubble ("hexagon") structures. We show the effect of an increasing value of $l_d$ on final steady-state patterns.

Figure 12A:
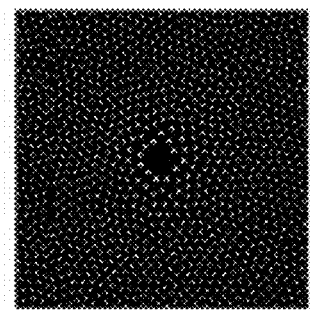
FIGS. 12A-C depict a sequence of final steady-state patterns for $C_0=0.29$, $l_d=0.3$, 0.5, 0.7 from left to right, where the defect is placed at the center of the square lattice of size $512^2$ and periodic boundary conditions are implemented.
Figure 12B:
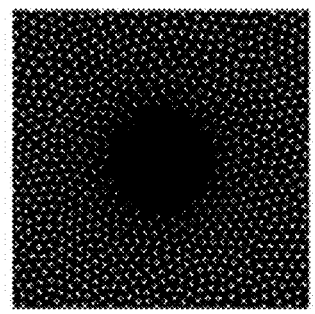
Figure 12C:
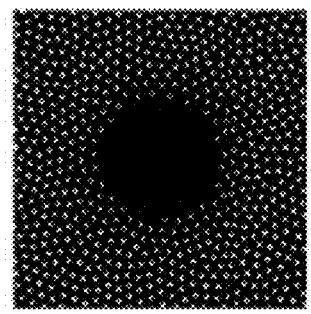
Figure 13A:
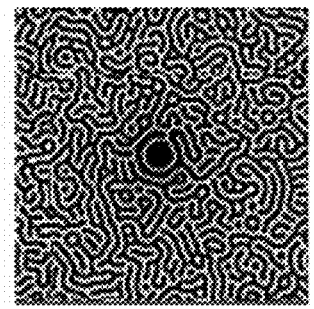
FIGS. 13A-C depict a sequence of final state patterns for $C_0=0.5$, $l_d$ is 0.3, 0.5, and 0.7 from left to right, where the defect is placed at the center of the lattice of size $512^2$ and periodic boundary conditions are implemented and time T=16000.
Figure 13B:
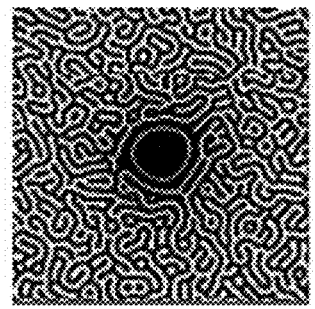
Figure 13C:
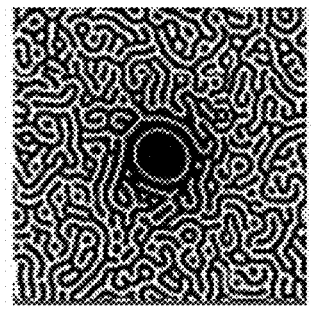

FIGS. 12A-C shows steady-state patterns at time T=16000. With increase in $l_d$, it is seen that the size of the defect core increases as well. Away from the core, bubble patterns persist as the defect has a finite range. For large $l_d$, the circular core is asymmetric due to finite size effects. The presence of even a single defect depletes the concentration of B in the core. This has ramifications for nanoscale self-assembly, such as ultrahigh-density magnetic data storage. In FIGS. 13A-C, we show, for comparison, a similar effect of a single defect when $C_0=0.5$.

Figure 14:
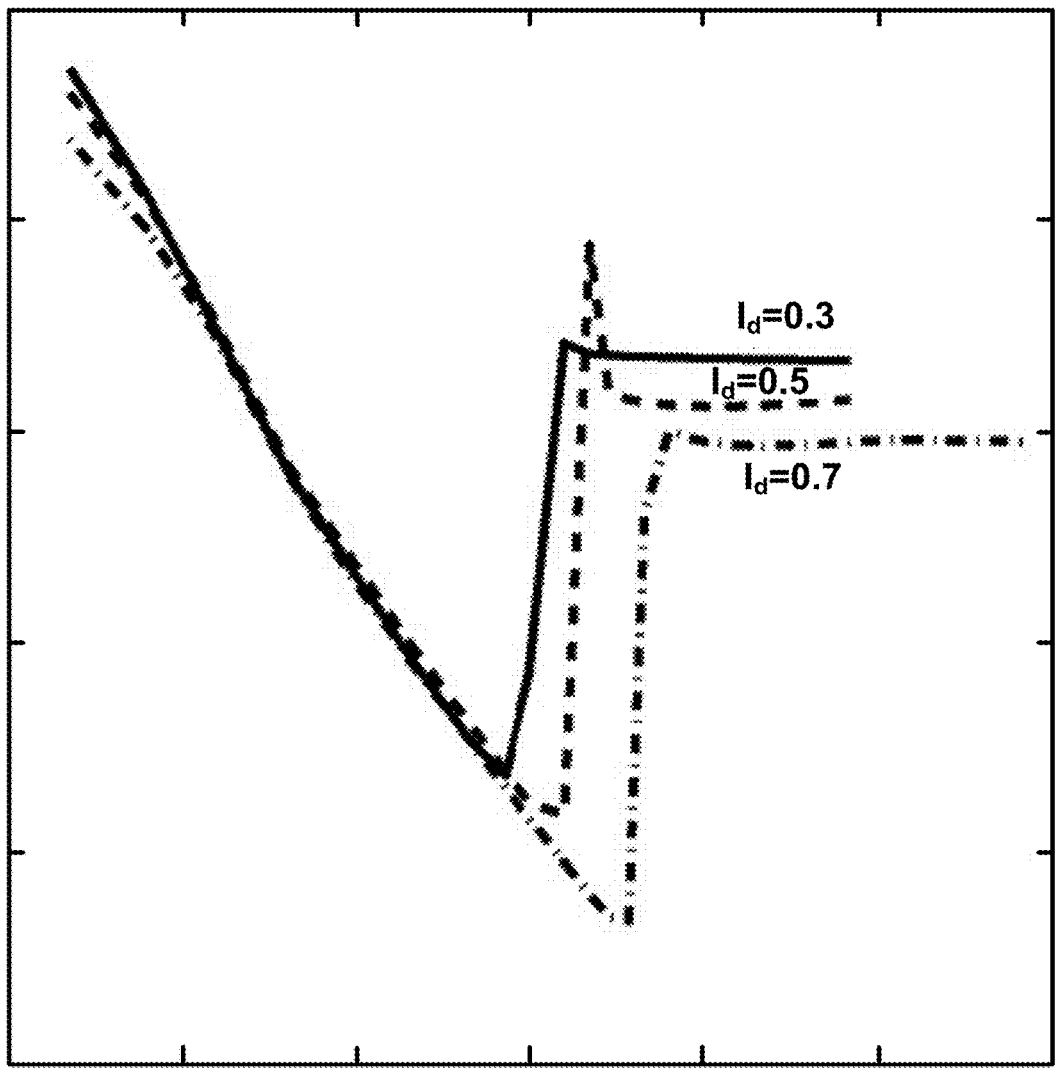
FIG. 14 depicts the Hessian measure $\mu(1.4,t)$ on data for which the average concentration $C_0=0.29$.
Figure 15A:
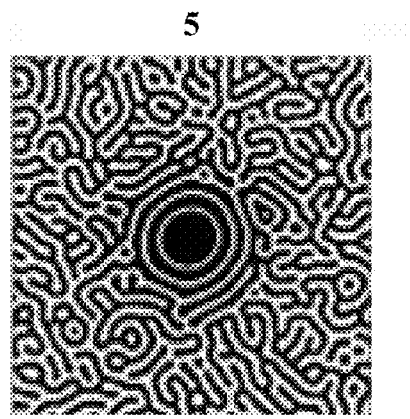
FIGS. 15A-D depict sequence of final state patterns for $l_d=1$. $C_0=0.5$. T=20000, where the number of stripes in the initial state is 5 (Top left), 25 (Top right), 40 (Bottom left), and 100 (Bottom right).
Figure 15B:
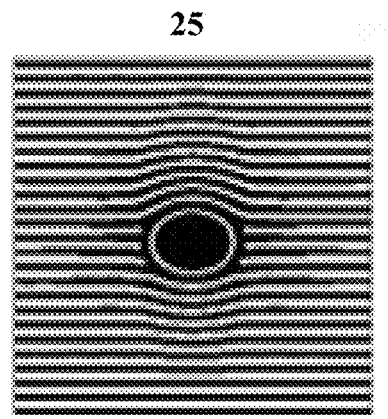
Figure 15C:
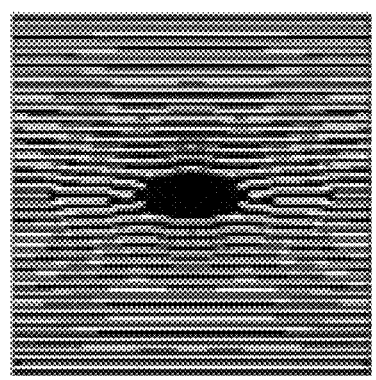
Figure 15D:
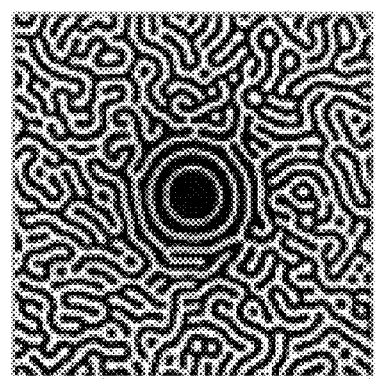
Figure 16A:
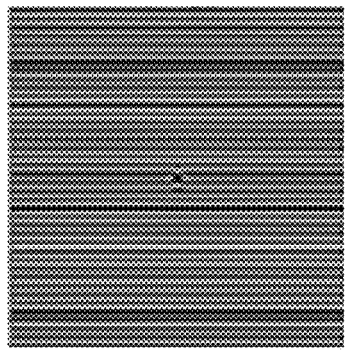
FIGS. 16A-D depict sequence of patterns in time for $l_d=1$, $C_0=0.5$, where the number of initial stripes is 40 and where the times at which the contour plots are shown are t=50 (Top left), t=1000 (Top right), t=8000 (Bottom left), and t=20000 (Bottom right).
Figure 16B:
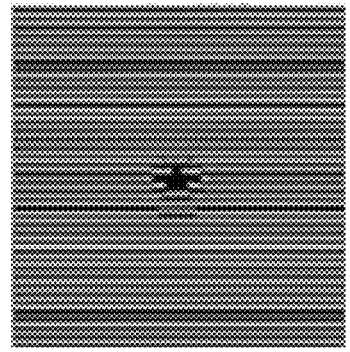
Figure 16C:
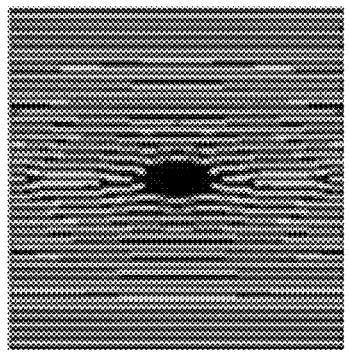
Figure 16D:
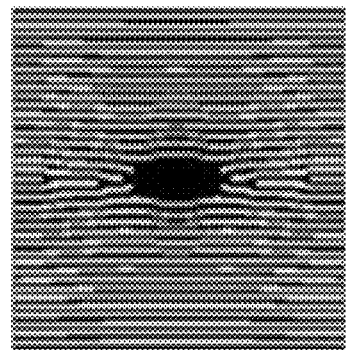
Figure 17A:
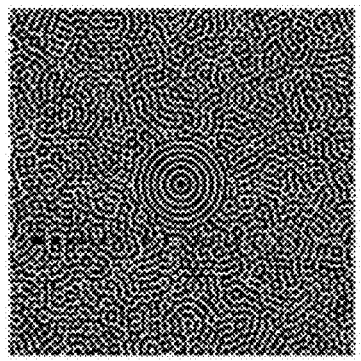
FIGS. 17A-D depict sequence of patterns in time for $l_d=1$, $C_0=0.5$, where the number of initial stripes is 100, the times at which the contour plots are shown are t=50 (Top left), t=1000 (Top right), t=8000 (Bottom left), and t=20000 (Bottom right).
Figure 17B:
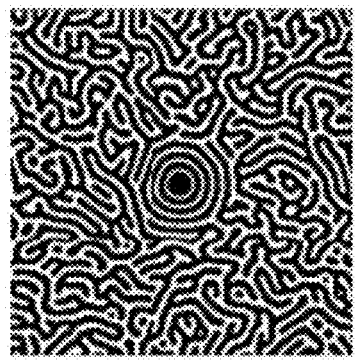
Figure 17C:
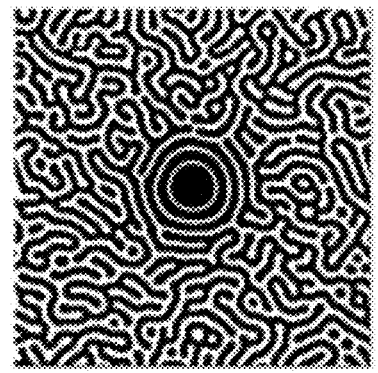
Figure 17D:
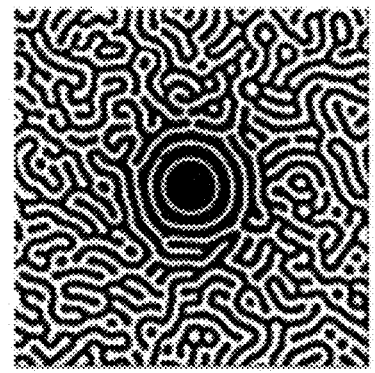

The central effect of the defect is to deplete a core region but far from the core, the patterns exhibit the same symmetry as in the absence of the defect. The defect core size increases with $l_d$, as for $C_0=0.29$. The pattern feature size (the wavelength A) increases with an increase in Id, similar to patterns in FIG. 11. An analysis of the single defect dynamics is done using the Hessian measure described in above. The results for $\beta=1.4$ and $C_0=0.29$ are shown in FIG. 14.

Beginning with a random uniform background and a single defect at the center, the defect core formation and the formation of structure (labyrinths or bubbles) is captured by a jump in the measure for all three values of $l_d$. As $l_d$ increases, it takes longer for the defect core and the patterns to form, as seen in FIG. 14.

A comment is in order about the size of the defect core. From the conservation law (in our case, that the average concentration $C_0$ is a conserved quantity), we have the following identity for any defect pattern.

$$A_{core}C_{core} + (A_{leading} - A_{core})C_{out} = A_{lattice}C_0 \quad (3)$$

leading to, $$A_{core} = \frac{A_{lattice}(C_{out} - C_0)}{(C_{out} - C_{core})} \quad (4)$$

Here, Alattice is the area of the lattice, Acore the area of the core, $C_0$ the average concentration, $C_{core}$ the average concentration inside the defect core, and $C_{out}$ the average concentration outside the core. We see from Equation (4) that for a finite lattice size, the area of the core is also finite. Moreover the conservation law also ensures that the size of the core cannot be equal to the lattice size.

In summary, we have investigated the effect of a single defect placed at the center of the two-species system assuming random initial concentrations. We find that the size of the defect core increases with $l_d$ and that regions far away from the core exhibit patterns with the same symmetry as in the absence of defects. Pattern sizes increase with $l_d$, as seen from FIGS. 12 and 13. A local measure such as $\mu(\beta, t)$ gives information on core and structure formation time. This time increases with $l_d$ (FIG. 14). For bubble patterns, a change in $l_d$ changes the number of bubbles on the first ring outside the core and the bubble size, which may be of relevance for the study of quantum corrals.

Numerical Results Ii, a Single Defect on Stripe Initial Conditions

We have studied the influence of a single defect on stripe initial states. The numerical simulations are carried out at mean concentration $C_0$=0.5. In FIG. 15, we display the steady-state patterns obtained at T=20000 for various numbers of initial stripes, with $l_d$=1.

Given the lattice size L, the number of stripes S corresponding to a wavenumber q is S=qL/2π. Applying the dispersion relation Equation (2), we see that the most unstable wavenumber $q_c$~0.598. This corresponds to $S_c$~48 stripes.

In FIG. 15, we notice that for the initial states with 5 and 100 stripes respectively, the defect annihilates an approximately circular core centered at the lattice center. The parallel stripe structure is lost in a short time (typically by around T=200). However, for the case where the number of initial stripes is 25 and 40, we see that the defect is unable to disrupt the stripe structure completely. Note that for S=25 and 40, the number of stripes is preserved in the steady-state, so that the initial wavelength does not change. However, for S=5 and S=100, the annihilation of the initial stripe patterns leads to labyrinthine patterns outside a central defect core.

A time series of images for the initial condition ($C_0$=0.5, $l_d$=1, and number of initial stripes=40) is shown in FIG. 16. FIG. 17 shows a time sequence of the concentration field when the initial state has 100 stripes.

These observations may be explained using the following argument. When the number of stripes is very small (small wavenumber), the phase boundary energy is small but the corresponding elastic energy is large. The system minimizes the sum of these energies by increasing the phase boundary energy while reducing the elastic energy. An increase in the phase boundary energy corresponds to the domain boundary length increasing, which is achieved by creating labyrinthine domains of a smaller wavelength. By creating domains of a smaller spatial size, the elastic energy reduces as well. This balance leads to an overall reduction in the free energy. A similar argument applies when the number of stripes is very large (large wavenumber). Here, the phase boundary energy cost is large, while the elastic energy is small. The balance is again achieved by lowering the phase boundary energy by domain coarsening, whilst increasing the elastic energy. Again, the free energy of the labyrinthine system is smaller than the initial state in this case.

We find that when S is between about 25 and 50 stripes, the stripe structure is maintained outside of a small defect core. Outside this range of stripe numbers, the defect destroys the stripe structure completely. From a technological perspective, it is necessary that the initial number of stripes be in the stable range so the defect does not destroy the initial state. The variation in $q_c$ with $l_d$ suggests that it is important to know the value of $l_d$ for the experimental substrate of ensure that the number of stripes is correctly chosen, to prevent annihilation by defects. Such stripe states are of use in nanoelectronic circuits as electrical conductors when the epilayer is appropriately chosen.

Two Defects

In this section, we consider the effect of the presence of two defects on random initial states. Shown in FIG. 18 are patterns at $C_0$=0.5 for two defects symmetrically placed about the lattice center along the x-axis for $l_d$=0.5 and L=512.

As the defect-defect separation (d) decreases, finite size effects of the defect core show up. Below a certain separation (for this system, this is $d_{crit}$=112), the defects carve out a central core that encompasses both defects. The effect is more pronounced for large $l_d$. FIG. 19 shows the effect of decreasing d on the two defect patterns.

In FIG. 19, we see that below a separation of d=52, the two defect core is smaller in size than the one defect core. This is evidence of the attractive interaction between the defects. Regarding the defects as charges placed on a line, we may interpret FIG. 19 as follows: After the defect cores overlap, the attractive interaction between them reduces the net effective "defect charge", resulting in a smaller core than for just one defect. This effect is not seen at large separations (refer to FIG. 18) due to finite size of defect core, implying a finite range of interaction.

Having two defects in a system raises the question of defect interaction. This may be quantified by computing the defect-defect interaction energy and from there, the defect-defect force. The energy computation involves computing the stress integral.[2] The dipolar form of the integral implies that this term is practically unchanged beyond a certain arbitrary (but large) radius. We do this computation on a $512^2$ lattice and find that using a radius of 100 lattice units for the computation of the integral term is enough to ensure convergence to less than a fraction of a percent. This has been tested by using radii of 100, 150, and 200 units.

The recipe for calculating the interaction energy of the two defect system is as follows. We define the energy of the zero defect system to be $E_0$. We also define the energy of the one-defect system to be $E_1$, and that of the two defect system to be $E_2$. Relative to the defect free state, the energies of the single defect and the double defect system are $E_{10}=E_1-E_0$ and $E_{20}=E_2-E_0$ respectively. The interaction energy of the two defects then is simply $E_1=E_{20}-2E_{10}$. In general, all of these quantities are functions of the distance coordinate. If defect 1 be placed at $\vec{r}_1$ and defect 2 at $\vec{r}_2$, with $r=\vec{r}_2-\vec{r}_1$, we assume that these energies depend only on $r=|\vec{r}_2-\vec{r}_1|$. Furthermore, we assume the system to have azimuthal symmetry and will therefore confine ourselves to varying the positions of the two defects along a single line bisecting the square lattice along the Y direction.

Figure 20:
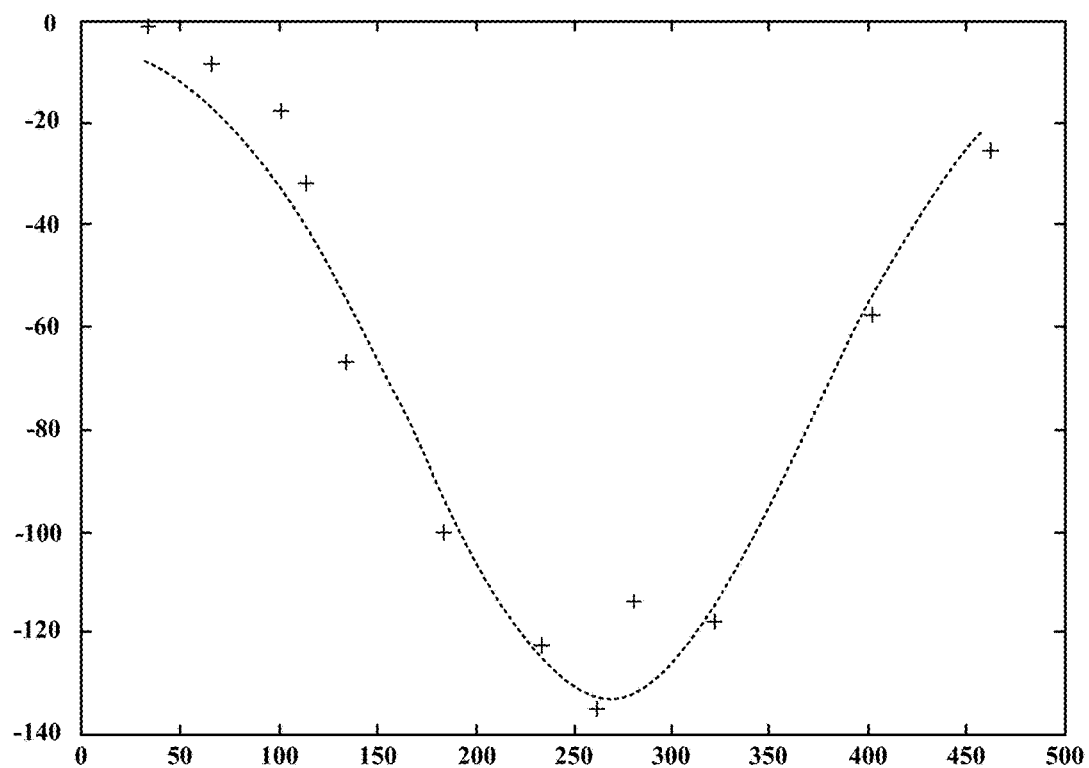
FIG. 20 depicts the force versus separation plot for two defects, where the force values obtained from the numerical simulations are shown as points while the smooth curve is a result of curve-fitting.

FIG. 20 shows a plot of the force between the defects computed from the interaction energy. The force is computed as the negative position derivative of the interaction energy and is shown below. We find that the force between the defects becomes small as the distance between them (henceforth labelled d) decreases. We fit the force in FIG. 20 using a function of the form $f(x)=A\exp[-\{(x-B)^2/C^2\}]$. It is found that the best fit is obtained for A=−130.60, B=268.324 and C=141.941. The numerically obtained data and the force fitting are both shown in the figure. The decaying of the force to small values at small separations is probably a result of defect-defect screening. It must be mentioned that the units of the force are in $h_0/b$ (both of these quantities are as mentioned in the theory above) and those of the distance are in units of b.

The defect-defect force decays to zero at small separations. For point defects, this would not be the case and the force would diverge as the separation decreased (analogous to point charges). But since the defect cores have a finite size, there is a screening effect that renormalizes the interaction between the two defects. In particular, the decay to zero indicates the screening effect mentioned.

Summary

We considered the problem of monolayer self-assembly from two different perspectives: (a) making desired patterns, such as large scale perfect dot and stripe arrays, and (b) the influence of defects on self-assembly. While (a) has a strong technological thrust from the viewpoint of nanoelectronic circuitry and ultrahigh density data storage, (b) is an unavoidable fact of almost any experimental system. In fact, we see from the study of defects that even a small number of them can significantly alter the symmetry of observed patterns. Therefore, defects have a direct relation with processes used to generate desired patterns. Our chief results are as follows.

1. Making desired patterns: Using masks to break the symmetry of random initial states leads to the formation of perfect dot arrays in the regions between the masks. For small amounts of noise ~, increasing the number of masks triggers a transition from bubbles to perfect striped arrays.
2. An increase in the noise of the distribution allows the formation of perfect dot arrays without any mask remnants (MRs). This is the result of increased diffusion across the mask regions. We also show by changing Co that one may tune dot sizes. This is of importance in data storage issues such as signal-to-noise ratios.
3. We consider the effect of defects on monolayer self-assembly; it is seen that even a single defect can have a drastic effect on observed patterns. The size of the defect core is proportional to the defect lengthscale ld—For initial stripe states, there is a range of initial wavenumbers where the defect cannot destroy the stripe symmetry; outside this range, the defect nucleates a central core with labyrinths outside. This is important from the viewpoint of nanoelectronic circuits where such stripes may be used as nanoscale current carriers.
4. The issue of two defects leads to considering their interaction. Computing the interaction force as a function of the defect-defect distance d shows that the force is attractive. The finite size of the defect cores screens the interaction and leads to the force decaying to zero at small separations.

Introduction and Motivation

Most novel applications of nano-sciences rely on electronic and optical properties of small-scale structures. We outline some of these features and indicate limitations in state-of-the-art "nanotechnologies": (i) Growth in the processing speed of semi-conductor chips and in the storage capacity of magnetic devices has been achieved through miniaturization. However, current techniques, e.g., lithographic, are rapidly reaching their limits; methods for further miniaturization need to be identified and developed. (ii) Thermodynamic, electronic, and optical properties of nano-structures are size dependent at the nanoscale, and differ significantly from those of bulk objects. With proper control, it should be possible to construct nanostructures with characteristics needed for specific applications. (iii) Since it is possible too implement detailed computations on nano-scale size systems, nanostructures can be used as an extremely fertile laboratory to test theoretical predictions based on quantum mechanics and nonlinear stability analysis.

Evidently, one of the key ingredients needed for continued growth of nanotechnology is the ability to create highly regular (both site and size controlled) arrays on an increasingly smaller scale. Nanoscale selfassembly—the spontaneous formation of regular arrays—is emerging as one of the most promising avenues for its implementation. Self-assembly has an additional advantage that it is significantly faster than lithographic etching, especially for large arrays. The achievement of perfect long range nanoscale order is critical for various technological applications such as nano-memory devices, quantum dot arrays, biosensor among others.

In particular: (i) For nano-memory devices, it is imperative that the fabricated nanostructures possess near-perfect long-range order. (ii) Quantum dots are tiny three-dimensionally confined (typically) semiconductor material structures where quantum effects become obvious, e.g., energy spectra become discrete. They are characterized by sharp density of states reminiscent of "atoms" and carriers are confined in all three dimensions. Quantum dots are of immense technological importance and, although several technological barriers remain for their application, are considered to be potentially useful for several revolutionary nanoelectronic devices and applications, e.g. next generation lighting (Arakawa, 2002; Nakamura et. al., 2000) lasers (Bhattacharya 2000; Lundstrom et. al., 1999), quantum computing, information storage and quantum cryptography (Lundstrom et. al., 1999; Chye et. al., 2002; Petroff et. al., 2003), biological labels (Alivisatos, 2000), sensors (Bhattacharya et. al., 2002) and many others. One of the primary bottlenecks in their experimental realization is the inability to reduce "inhomogeneous broadening". The latter refers to the loss of sharp physical characteristics due to non-uniformity in the size and imperfections in long-range order. Since opto-electronic properties acutely depend upon quantum dot size and spacing, inhomogeneous broadening reduces applicability. For example in lasers: spectral hole burning limits gain in lasers; broadens emission between 30-70 meV even for a 15% size-fluctuation; hinders the "promised" temperature stabilized operation and so on [e.g., see the following and references therein: Baier et. al. 2004; Asran and Luryi, 2003; Belyavski. and Shevtsov, 2002; Cingolani and Rinaldi, 2003; Deppe et. al. 2005; Qasaimeh, 2003].

Figure 21A:
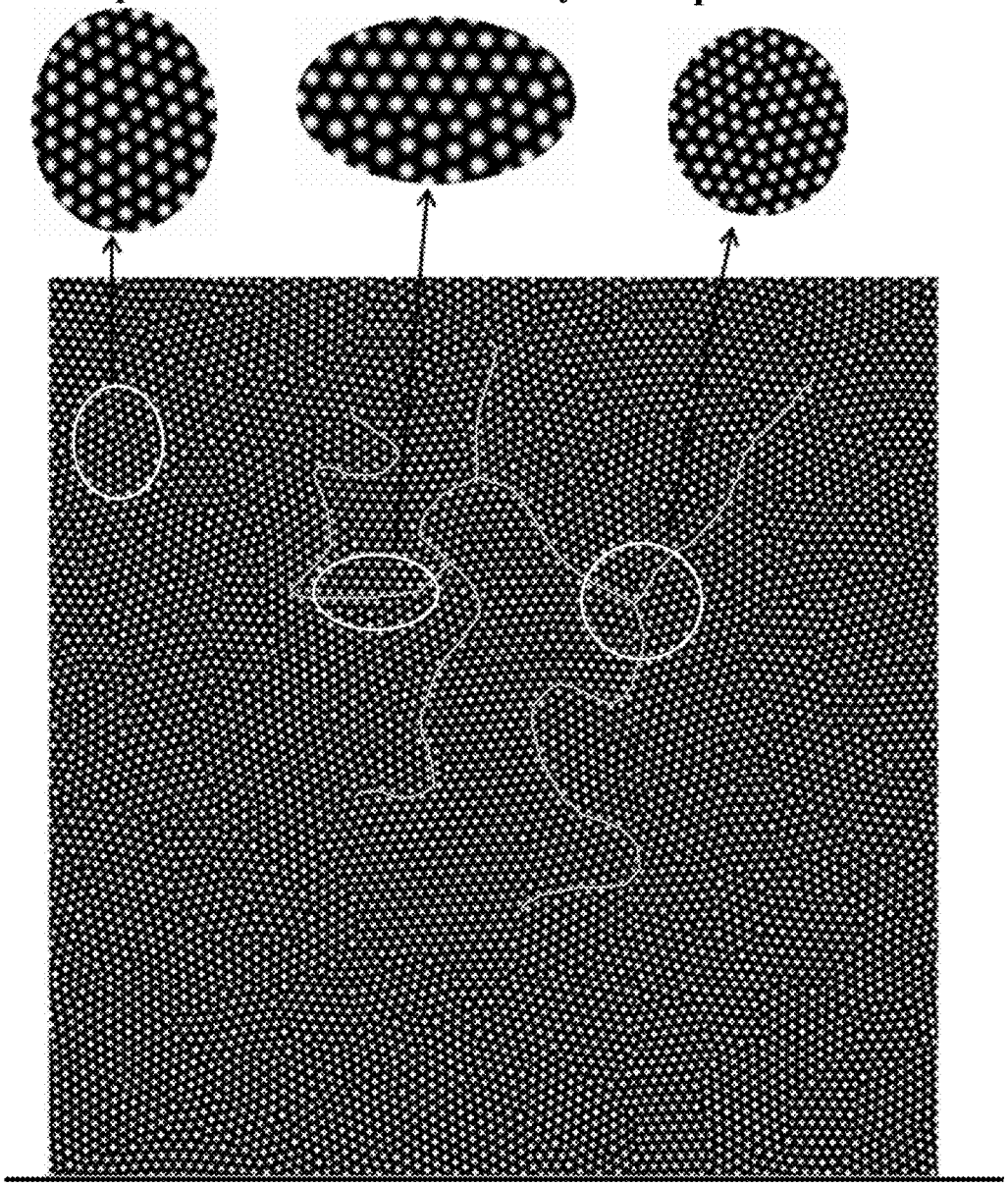
FIG. 21A depicts a texture generated in a two dimensional domain by integrating the Suo-Lu model with periodic boundaries and Q=1.6, and Q=1.6. The deposition is given by a random field C(x,y)=0.32±0.01, which has a mean concentration of $C_0=0.32$. Bright dots denote areas of high concentration of the monolayer, while dark areas represent locations of low concentration. The texture contains domain walls, triple junctions where two domain walls meet, and penta-hepta defects. Few representative defects have been highlighted. Patterns generated using other statistically similar depositions are different in detail, but have similar statistical features.
Figure 21B:
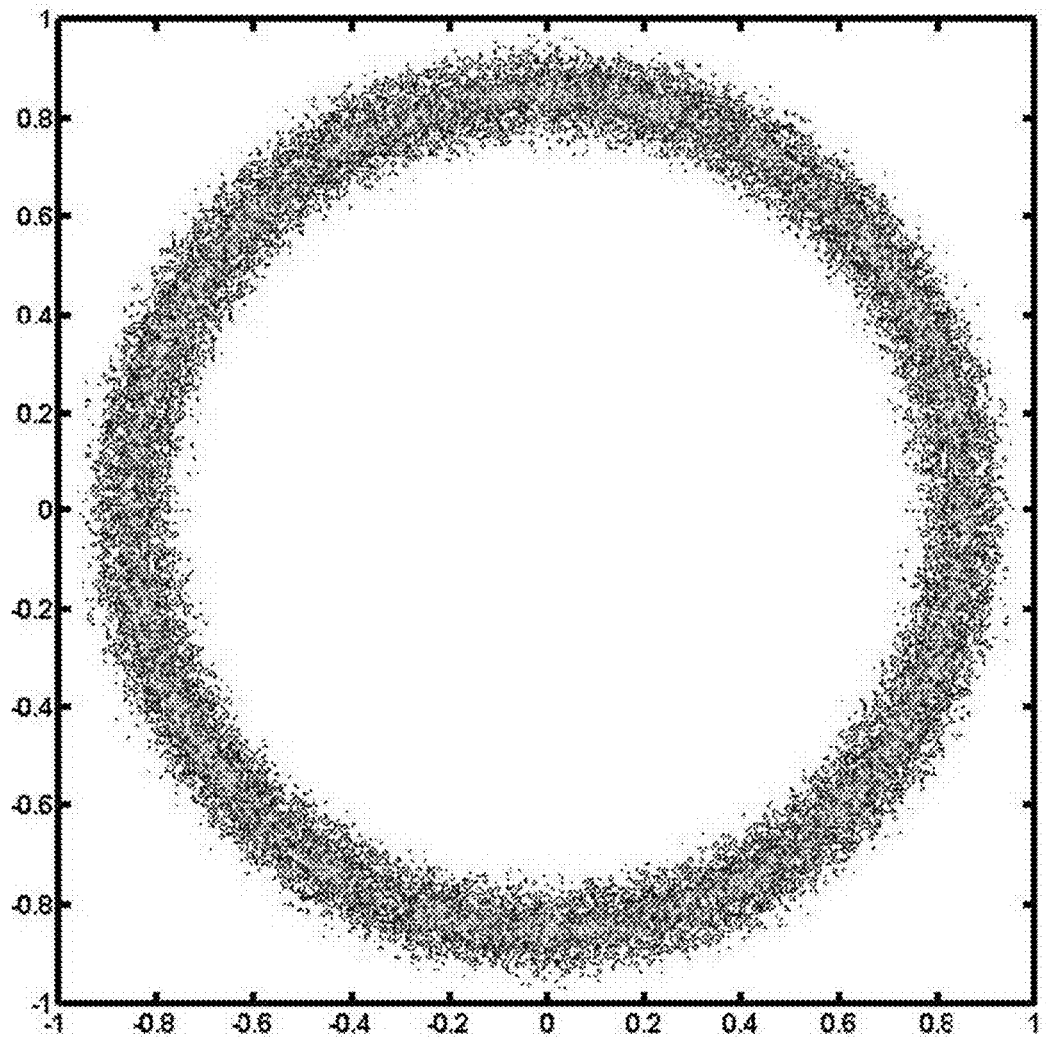
FIG. 21B depicts the sum of power spectra of 10 images generated under conditions identical to (a) except for the initial random seed. Note the isotropy of the spectrum.

Consider a self-assembly experiment, where a spatially uniform spread of atoms are deposited on a monolayer, epitaxially or through chemical vapor deposition. Several experimental and computational studies have documented the ensuing results. An example, generated using a paradigmatic model of self-assembly (to be described shortly), is shown in FIGS. 21A-B. Similar structures have been observed in many experimental systems. In the case shown, the conditions (e.g., mean concentration, temperature and so forth) are such that hexagonal pattern are known to be stable.

As well evident, the texture displays locally hexagonal domains; however, it contains multiple "grains" with differing orientations. Also manifest are the presence of concomitant "grain boundaries" or "domain walls", triple junctions, dislocations and disclinations—the latter two consist of penta-hepta defects.

FIGS. 21A&B underscores a major common feature of self-assembled structures on model or experimental systems: lack of long-range order and presence of defects. As motivated in the preceding paragraphs, this inadequate control of size, site and long-range order is one of the key bottlenecks in the use of self-assembly for most technological applications.

Here, we introduce a strategy and establish conditions to guide perfectly long-range ordered structures, based on insights from the theory of pattern formation. We introduce the central concepts in Section 2 and present our major results in Section 3. Section 4 discusses the implications and conditions needed to generate perfect arrays experimentally. The Appendix provides a brief outline of the model and calculations that are utilized herein.

Section 2. Central Concepts

We begin by outlining why defective patterns (such as FIGS. 21A&B) are so ubiquitous—a fact evident in structures generated on most experimental and model systems.

Consider a paradigmatic model of self-assembly proposed by Suo and Lu. It represents slow, spatially uniform deposition of atoms on a substrate, and gives the spatio-temporal dynamics of the (coarse-grained) fractional coverage $C(x,y)$ of the monolayer. The concentration field is normalized so that total coverage of the substrate is represented by $C(x,y)=1$. The model includes three ingredients essential for self-assembly: (1) phase separation, which describes the affinity of monolayer atoms to each other, (2) phase coarsening, which quantifies the energy density of an interface between neighboring occupied and vacant monolayer regions, and (3) phase refining, which limits the growth of a domain, and has its origins in the nonuniformity of the surface stress. Note that (1) and (2) serve to increase the size of a domain while (3) acts to set an upper limit. The Suo-Lu model, whose terms are more fully described in the Appendix, is the following Cahn-Hilliard type Equation (1):

$$\frac{\partial C}{\partial t} = \nabla^2 \left[ P(C) - 2\nabla^2 C + \frac{Q}{\pi} I_0 \right] \quad (1)$$

where $P(C)=\log(C/1-C)+\Omega(1-2C)$, and $I_0$ is an integral associated with the elastic energy due to the non-uniformity of surface stress [Refs]. The appearance and stability of different textures depend on three control parameters. The first, Q, is the ratio of the typical length-scale associated with a texture (for example, the nearest neighbor distance in a hexagonal state) and the characteristic width of an interface between occupied and vacant domains. The second, $\Omega$, characterizes the free-energy function. The final control parameter, $C_0$ is the mean coverage $\langle C(x,y) \rangle$, which is conserved in the model. FIGS. 21A&B was obtained by evolving a random initial state under Equation. (1). Others have also presented results predicated on this model and its agreement (at least qualitatively) with observed experimental patterns verifying the utility of this model in predicting expected experimental results.

The model (1) is isotropic and homogeneous. Self-assembly in the system occurs due to spontaneous symmetry breaking, whereby the uniform monolayer bifurcates to one with less symmetry as a control parameter (say, $C_0$) is varied. Spontaneous symmetry breaking does not lead to a unique solution, but rather to an entire family of equivalent solutions (the so-called Goldstone modes or group orbit). These equivalent solutions correspond to periodic hexagonal arrays with differing orientations and placement. In other words, when an isotropic and homogeneous system self-assembles, the orientation of the resulting texture can be arbitrary, and is determined by uncontrollable factors like small fluctuations in the deposition. In large aspect ratio systems, domains further than a "correlation length" orient in independent directions, resulting in a labyrinthine texture rather than a single domain with long-range order. However, the orientations of domains are distributed isotropically, as seen from FIG. 21B.

The proposed method to achieve perfect long-range order rests on two ingredients: (i) Induce an external stimulus to remove the orientational degeneracy of the epitaxial system. (ii) Find control parameters where only a sufficiently small range of length-scales are allowed for stable hexagonal arrays. This rationale for these proposals (in particular the second) is quite subtle and will be further explained below. We emphasize here that although our studies are conducted on an ideal isotropic system, there is no difficulty in extending our arguments and general strategy to cases and models where are the underlying substrates are elastically anisotropic.

The first step is to introduce a technique to break the isotropy of the physical system, which consists of the substrate and the epitaxial deposit. The present method employs "masks" to selectively impede the deposition. The mask consists of two arrays of uniform parallel stripes oriented 60° apart (see FIG. 22A). The deposition, and hence the epitaxial system, are now anisotropic, and contains two preferred orientations. Hexagonal textures generated on the monolayer are found to be oriented so that directions associated with the mask are parallel to two of their six axes of symmetry. FIG. 22B shows a pattern generated by evolving Equation (1) in the presence of the aforementioned masks. The atoms deposited with the mask in place can diffuse to sites under the mask. However, as can be seen from the power spectra shown in FIG. 22C, orientations of the hexagonal array still fluctuate about directions specified by the mask. As a result, patterns still contain domain walls and defects.

Figure 23A:
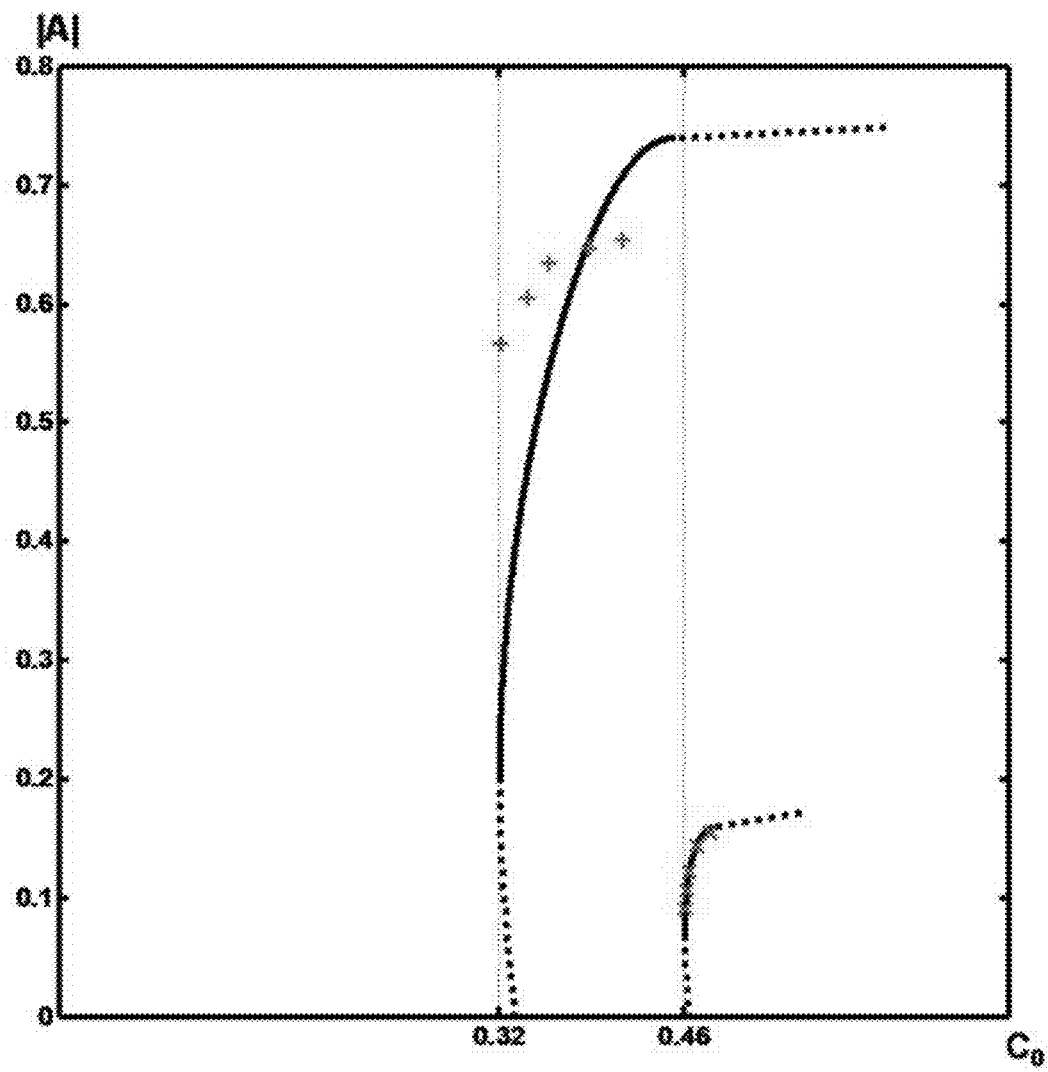
FIG. 23A depicts bifurcation diagrams at control parameters $(\Omega 1,Q1)=(1.6,1.6)$ and $(\Omega 2,Q2)=(1.76,1.0)$, for the transition to hexagonal states of Eqn. (1), showing the variation in the amplitude of the hexagonal state as a function of C0. Solid lines show the first order approximation outlined in the Appendix and crosses represent estimates from numerically generated textures.
Figure 23B:
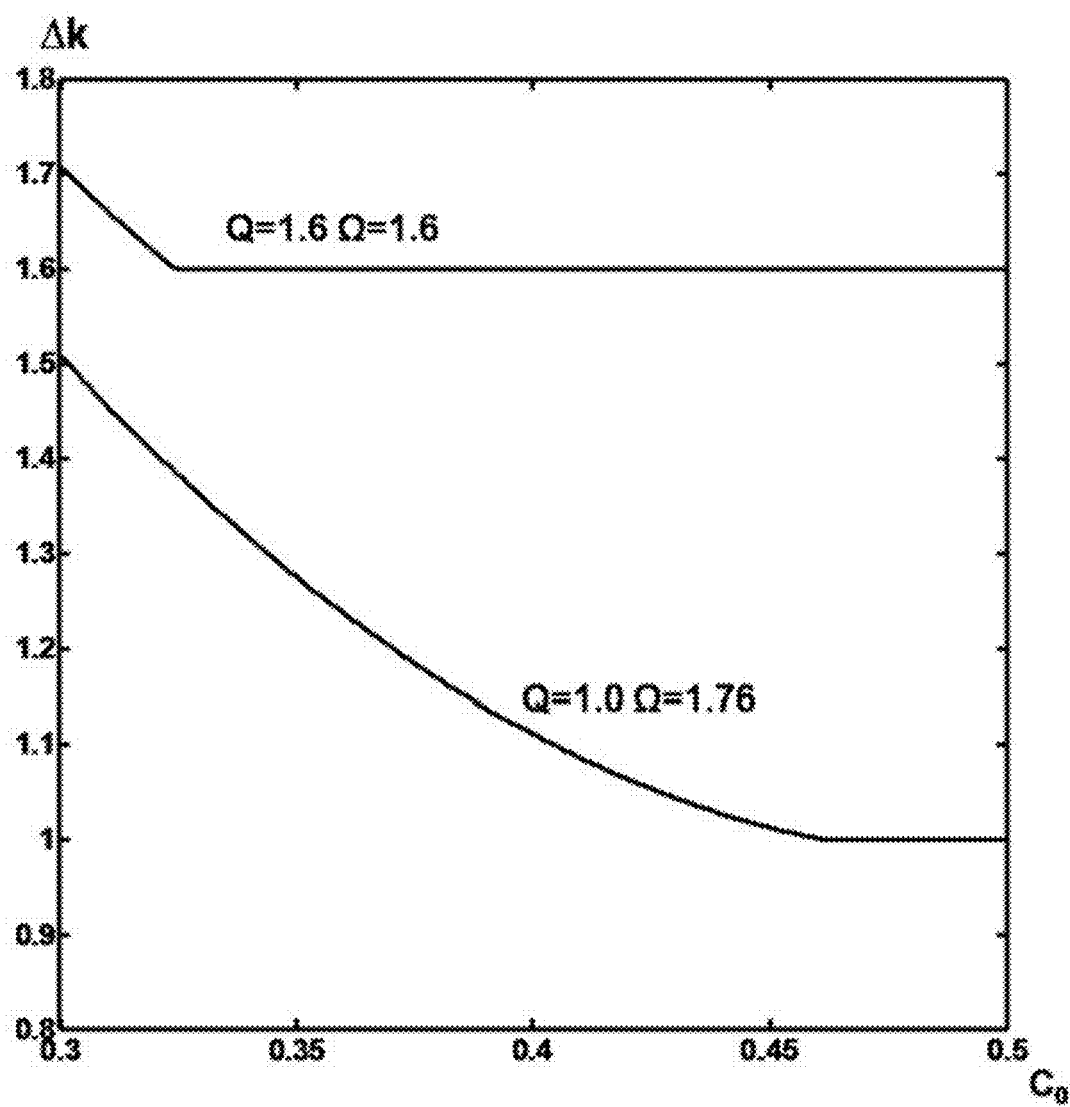
FIG. 23B depicts the range $\Delta k$ of wave-vectors where stable hexagonal arrays can be formed. It is known that characteristic hexagonal domain size at the given set of control parameters is inversely proportional to $\Delta k$. We thus expect domain sizes at $(\Omega 2, Q2)$ to be larger than those at $(\Omega 1, Q1)$.

The remaining challenge is to remove the small fluctuations in domain orientations. To motivate the method, we make the following well-known observation from the theory of patterns. For a given a set of control parameters, hexagonal arrays within a range $\Delta k$ of wave-vectors can be stabilized. Furthermore, characteristic domain size in a texture generated at these control parameters is inversely related to $\Delta k$. In the Appendix, we outline how this range can be estimated for model (1). The idea, then, is to find control parameters $\Omega$ and Q such that the range $\Delta k$ is sufficiently small. As an example, we show the behavior of $\Delta k$ as a function of $C_0$ for the control parameters $(\Omega 1,Q1)=(1.6,1.6)$ used to generate FIGS. 21A&B and 22A-C, and for a second set $(\Omega 2,Q2)=(1.76,1.0)$. We thus expect domains formed at $(\Omega 2,Q2)$ to be larger. This expectation is indeed verified by integration of model (1). It should be noted, though, that the range of $C_0$ for which hexagonal arrays are stable is significantly smaller at $(\Omega 2,Q2)$, as seen from FIGS. 23A&B.

All remaining integrations reported in the paper are implemented at $(Q2, \Omega 2)$ with a mean concentration, $C_0$, chosen to be 0.46, within the stability map of hexagonal arrays.

Section 3. Methods and Results

The monolayer growth is modeled as follows. We first deposit epitaxial atoms at a uniform density $C_1=0.30\pm 0.01$, which is less than the concentration 0.46 where the symmetry breaking bifurcation to the hexagonal state occurs. The monolayer is homogeneous at this stage. Next, the mask in introduced, and the remaining atoms are deposited (with a stochastic term of amplitude 0.01) so that the overall mean concentration is $C_0=0.46$. Under these conditions, the monolayer is expected to experience a spontaneous symmetry breaking to a hexagonal state. Note that the symmetry breaking is not induced in the absence of the stochastic term. The numerical integration of model (1) is conducted for a time 105 units using the semi-implicit spectral method [Ref. Suo and Lu]. In each case, we verify that the field $C(x,y)$ remains unchanged during the last half of this time interval.

Figure 24A:
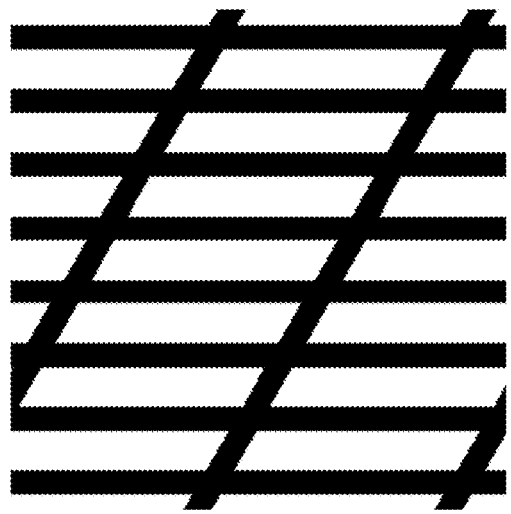
FIG. 24A depicts results from the numerical integrations of model (1) with masked deposition. (a) The mask used for the integration. The width of stripes on the mask is 3.4, in units of the nearest neighbor distance of the hexagonal array. The inter-stripe distance of the horizontal array is 12.0 units; the horizontal extent of the integration domain is 73.0 units while the vertical extent is 91.3 units.
Figure 24B:
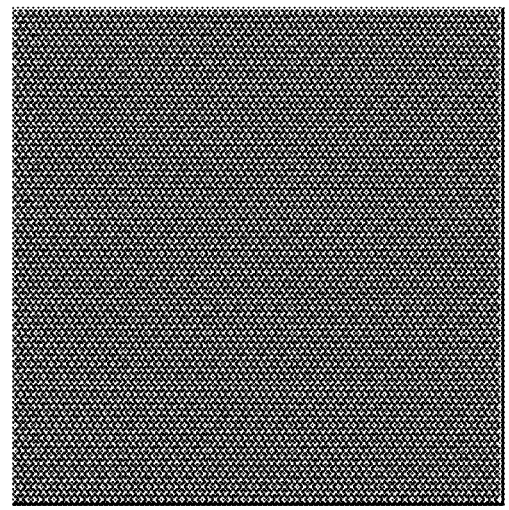
FIG. 24B depicts a texture generated by integrating model (1) at control parameters (Q2, $\Omega 2$) and C0=0.46. Note that there are defects near the top and bottom edges because the oblique set of stripes of the mask do not match periodically. The image shown is one of height 73.0 units away from these edges.
Figure 24C:
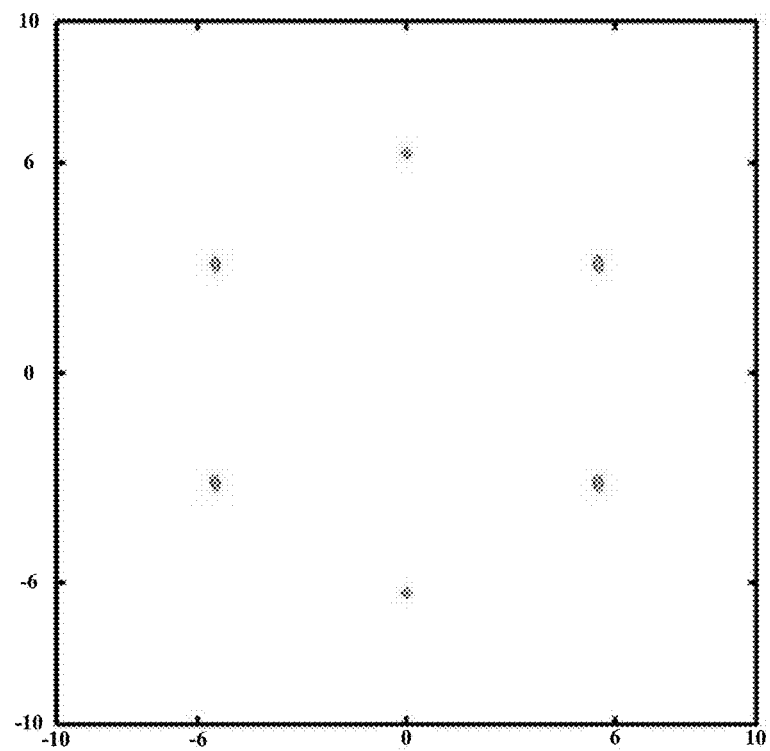
FIG. 24C depicts the power spectrum of the image shown in FIG. 24B.

The mask used for the integration is shown in FIG. 24A. It consists of two arrays of uniform, equally spaced stripes. Stripes of the first array are parallel to the x-axis, while those in the second bear an angle of 60° to it. Each stripe has a width of 3.4 units, where the unit of length is the nearest neighbor distance on the hexagonal array. The inter-stripe distance of the horizontal stripes are 12.0 units. The domain of integration has a horizontal extent of 73.0 units; numerical integration is implemented with 1024 lattice points and periodic boundary conditions in this direction. The choice of the vertical extent of the domain is subtle. On a square lattice, the oblique set of stripes of the mask will not match periodically at the top and bottom boundaries. As a result, the texture develops defects near these edges. We circumvent this problem by integrating model (1) taking a larger vertical extent containing 1280 lattice points and only considering monolayer sites sufficiently far from the top and bottom edges. FIG. 24B shows the texture formed in a 1024×1024 sub-domain. It clearly is a single domain with long-range positional and orientational order. The power spectrum, shown in FIG. 24C, confirms that the image is indeed a single, perfect hexagonal domain. We are able to generate perfect domains, which are 4 times as large at these control parameters, although the computations are almost prohibitive at this stage.

We have verified that the orientation given by the lattice on which the integration is carried out play no role in the texture. Specifically, if the mask is rotated by 45°, then a perfect hexagonal array oriented 45° to the original obtains. However, it should be noted that, the domain used for the integration needs to be extended in both x- and y-directions because neither set of striped arrays in the mask can be made to be periodic in this domain.

Figure 22A:
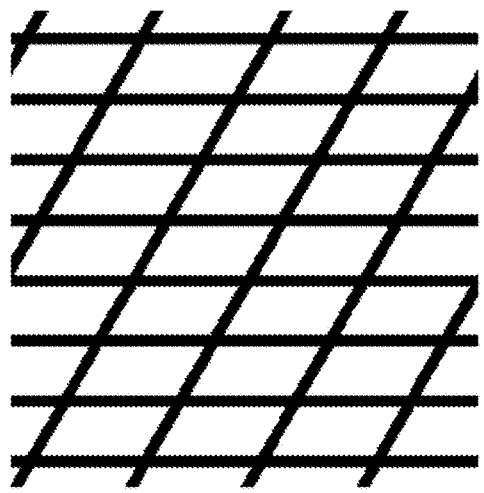
FIG. 22A depicts a mask used to selectively impede the deposition. Note that the width of the stripes and the inter-stripe distance are significantly larger than the nearest neighbor distance of the hexagonal array.
Figure 22B:
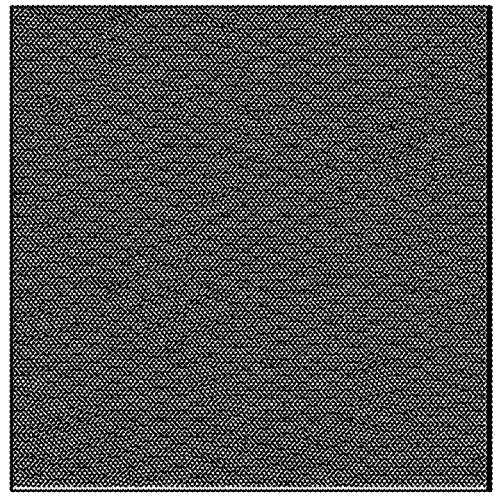
FIG. 22B depicts patterns generated are oriented so that two of their symmetry axes are parallel to directions specified by the mask.
Figure 22C:
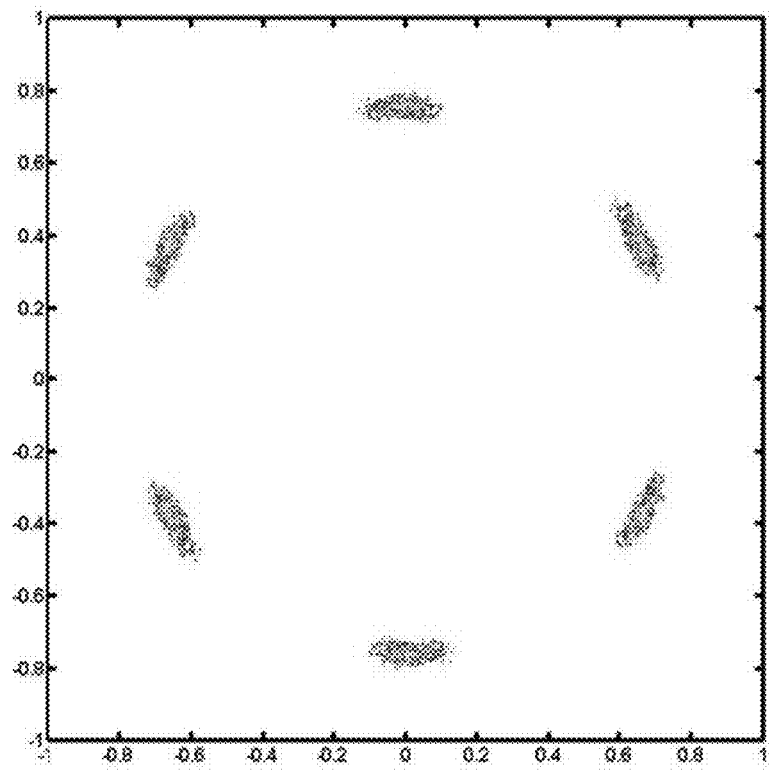
FIG. 22C depicts a power spectrum of the pattern of FIG. 2B, which still shows small fluctuations in orientations of domains.
Figure 25A:
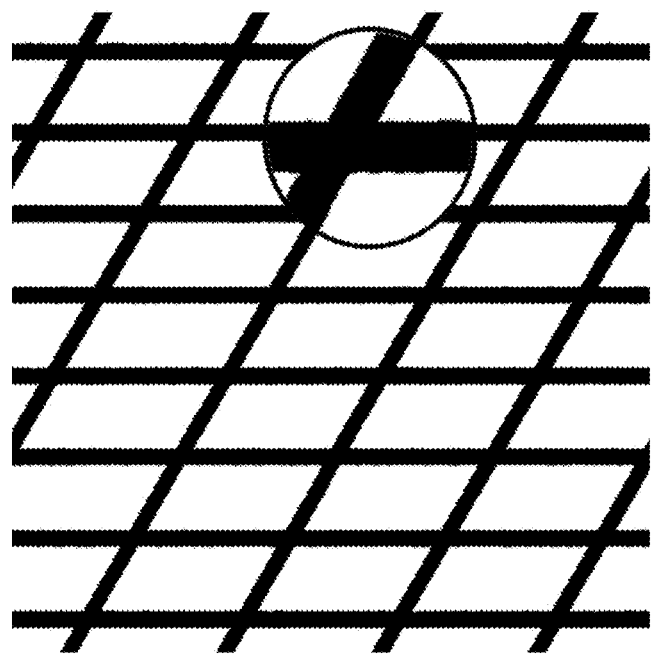
FIG. 25A depicts hexagonal states generated when the mask contains irregularities. (a) Irregularities of 12% are included in the mask.
Figure 25B:
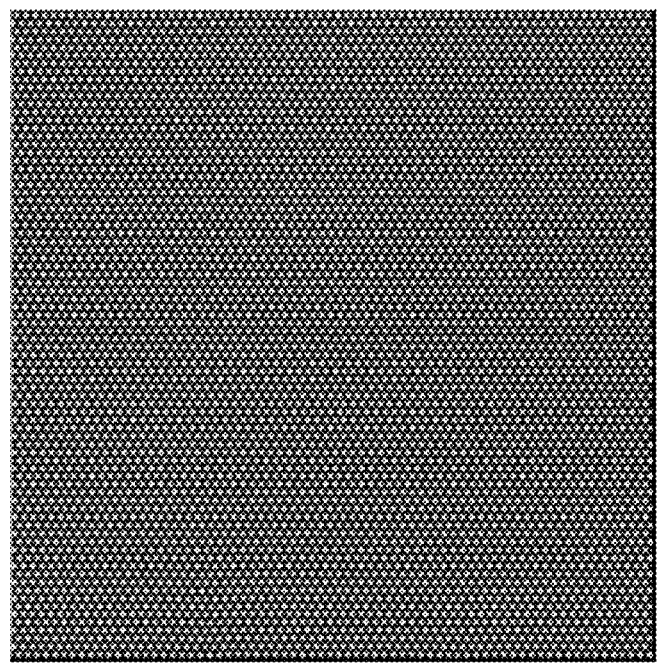
FIG. 25B depicts the texture generated continues to be a perfect, single hexagonal domain.

Masks shown in FIGS. 22A and 24A have perfect geometric shape; the stripes have fixed width and inter-stripe distance is constant. It is not possible create such ideal nano-scale structures. The current state-of-the-art lithographic techniques can give the required stripes to within 5-10% level of irregularity of the edges. The distance between two neighboring masks may also be subject to the similar manufacturing error. In order to test if the technique introduced here can prove useful in an experimental setting, we take these factors into consideration in computational studies. FIG. 25A shows a texture generated when each site on an edge is changed by a random variable that is uniformly distributed over a range whose magnitude is 12% of the width of the stripe-width. As seen from FIG. 25B, these irregularities do not prevent the formation of a large-scale ordered hexagonal pattern.

4. Discussion

Lithographic techniques used to design electronic components are rapidly reaching their limits for miniaturization. Nano-scale self-assembly is emerging as one of the most promising alternatives, especially for industrial scale design of uniform arrays. Self-assembled patterns can have length-scales that are an order of magnitude smaller than current state-of-the-art lithographic techniques. For example, when a monolayer of silver deposited on a ruthenium (001) surface is exposed to sulfur, a hexagonal array of nearest neighbor distance ~3.4 nm is formed. Deposition of sulfur on Cu (111) substrate at low temperature leads to the formation of honeycomb-like structures with a length scale of 1.67 nm. A network of equilateral triangles of side 3 nm was observed when a Ag monolayer of fractional coverage 0.8 is deposited on Cu (111) substrate at room temperature. However, in most systems, monolayer growth on the coarser scale of several nanometers exhibits isotropy. Consequently, self-assembled patterns, which occur as a result of spontaneous symmetry breaking, have an orientational degree of freedom. This degeneracy results in a lack of positional and orientational order in large aspect ratio systems.

We have used a pair of modifications of an experimental setup that can be used to guide the formation of large-scale ordered hexagonal arrays during sub-monolayer deposit on a substrate; its efficacy is demonstrated using a phenomenological model of self-assembly. The technique has two components. The first—a relatively easy task—is to implement selective masking of the deposition. When a mask consisting of two regularly spaced striped arrays bearing an angle of 60° with each other is used, orientations of domains of the texture formed are shown to be determined by the orientation of the mask, however with stochastic fluctuations. This contrasts with large aspect ratio patterns generated without the mask whose domains are oriented isotropically. The remaining task is to increase the characteristic domain size by varying the control parameters. We have shown that perfect large-scale arrays of hexagons can self-assemble when these two conditions are imposed.

Nearest neighbor distances for self-assembled nanostructures are of the order of 5-10 nm. The corresponding width of the masks of FIGS. 25A-C and 26A&B are ~20 nm, and they are ~75 nm apart. With current technology, it is possible to produce striped arrays of this size, using very elaborate and time-consuming techniques. However, note that in the proposed scheme, the mask is only used to guide the nano-scale growth, and can be re-used.

As we stated earlier, we used periodic boundary conditions to implement integrations of Equation (1). One problem we encountered was that oblique stripes of the mask could not be made to match periodically at the top and bottom edges of the domain of integration. Consequently, there were defects that formed near these borders. However, this is only an artifact of the choice of periodic boundary conditions for integration. It will not effect experimental patterns, whose extent can be large as needed using a sufficiently large mask.

Note that techniques introduced here are system independent. Specifically, given that an epitaxial system forms sub-monolayer structures, the system needs to support phase coarsening and refining. Hence, the Suo-Lu type models capture the broad physical features of the system. The main experimental challenge is to find control parameters to increase the characteristic domain size; this is significantly more difficult to implement. It requires the proper choice of substrates and deposits. Preliminary experiments, conducted without a mask, can be used to assess systems that have sufficiently large domain sizes. Our studies were conducted on a phenomenological model of epitaxial deposition on a homogeneous and isotropic substrate. Such systems have the largest freedom in the choice of the orientation of hexagonal domains. Consequently, they are the class of systems where it is most difficult to generate large scale ordered arrays. We believe that it will be easier to form ordered patterns in the presence of anisotropy. These studies are being conducted.

The methodology described herein is well suited for a template for forming quantum dots arrays, for biosensors grown on columns of the templates of this invention, or patterning any other nano-structure. The present method was conducted on a phenomenological model of epitaxial deposition on a homogeneous and isotropic substrate. Such systems have the largest freedom in the choice of the orientation of hexagonal domains. Consequently, they are the class of systems where it is most difficult to generate large scale ordered arrays. We believe that it will be easier to form ordered patterns in the presence of anisotropy.

Appendix: The Suo-Lu Model and Hexagonal Arrays

The analyses reported in the paper are conducted on a phenomenological model of self-assembly, introduced by Suo and Lu. Self-assembly is analyzed in terms of the (coarse-grained and normalized) concentration field $C(x,y)$ of the monolayer that is slowly deposited on a substrate, for example using epitaxy or chemical vapor deposition. Occupied and unoccupied regions of the monolayer are considered to be two "phases" The Suo-Lu model is constructed to include three processes needed for self-assembly, namely (1) phase separation, (2) phase coarsening, and (3) phase refining. The spatio-temporal dynamics of the concentration field is given by $$\frac{\partial C}{\partial t} = \frac{M}{\Lambda^2}\nabla^2\left[\frac{\partial g}{\partial C} - 2h_0\nabla^2 C + \phi\varepsilon_{\beta\beta}\right] \quad (2)$$

where M represents the mobility of the atoms deposited on the substrate, $\Lambda$ the number of substrate atomic sites per unit area, $h_0$ the energy cost due to variations in the concentration field and $\varphi$ the rate of change of the surface stress with respect to $C(x,y)$. $\Omega$ is the exchange energy associated with the thermal energy kT. The thermodynamic free energy density $g(C)$ is given by $$g(c)=g_A(1-C)+g_B(C)+\Lambda kT[C \ln C+(1-C)\ln(1-C)+\Omega C(1-C)] \quad (3)$$

where $g_A$ and $g_B$ are the excess energies of fully occupied and fully vacant epilayer sites respectively. k denotes the Boltzmann constant and T the absolute temperature. In Equation (1), $\varepsilon_{\beta\beta}$, expressing the elastic surface strain field, has the form $\varepsilon_{\beta\beta}=-(1-v^2)\varphi I_0/\pi E$, with $$I_0 = \int\int\frac{(x-\xi_1)\partial C/\partial\xi_1 + (y-\xi_2)\partial C/\partial\xi_2}{[(x-\xi_1)^2+(y-\xi_2)^2]^{3/2}}\partial\xi_1\partial\xi_2 \quad (4)$$

where E and v are Young's modulus and Poisson's ratio, respectively. This strain inhomogeneous surface stress is the origin of phase refining. Equation (2) can be spatially and temporally rescaled using (Suo, Z. and W. Lu, 2001), $$b = \sqrt{\frac{h_0}{\Lambda kT}} \text{ and } \tau = \frac{b^2}{MkT},$$

respectively. It is convenient to introduce a second length scale, $$l = \frac{Eh_0}{(1-v^2)\phi^2}.$$

Note that b is the typical width of an occupied domain and l is the characteristic thickness of an interface between occupied and vacant domains. With these resealing, Equation (2) reduces to $$\frac{\partial C}{\partial t} = \nabla^2\left[P(C)-2\nabla^2 C + \frac{Q}{\pi}\int\int\frac{(x-\xi_1)\partial C/\partial\xi_1 + (y-\xi_2)\partial C/\partial\xi_2}{[(x-\xi_1)^2+(y-\xi_2)^2]^{3/2}}\partial\xi_1\partial\xi_2\right] \quad (5)$$

where $Q=b/l$ and $P(C)=\ln(C/(1-C))+Q(1-2C)$. This is the Suo-Lu model.

The control parameters used in our study are Q, $\Omega$, and the mean coverage $C_0=\langle C(x,y)\rangle$ of the monolayer.

The concentration field for hexagonal states can be expanded to first order $$C(x,y)=C_0+R(e^{ik_1\cdot x}+e^{ik_2\cdot x}+e^{ik_3\cdot x}) \quad (6)$$

where R ($\ll C_0$) is the "amplitude" of the hexagonal state, and $k_1$, $k_2$, and $k_3$ are a triad of vectors bearing an angle 120° with each other. We choose $k_1=x$, $k_2=(-x+\sqrt{3}y)/2$, and $k_3=(-x-\sqrt{3}y)/2$. Note that, the expansion can be carried out to higher order by including terms arising from nonlinear interaction between these "basic" modes. Writing $C=C_0+\delta C$, and expanding P(C) about $C_0$ gives:

$$P(C) = \log\frac{C_0}{1-C_0} + \sum h_n(\delta C)^n \quad (7)$$

where $h_1=C_0^{-1}+(1-C_0)^{-1}-2\Omega$, and $h_n=(-1)^{n+1}C_0^{-n}+(1-C_0)^{-n}$ for n>1. Substituting this expression and (6) in Equation (5), expanding to third order in R, and equating the coefficients of $e^{ikx}$ gives $$12h_3R^3+2h_2R^2+(h_1-2k^2+Qk)R=0| \quad (8)$$

with three solutions R=0, $R_\pm$. Solid lines of FIG. 22A show the (largest) amplitudes for $R_\pm$ for the two sets of control parameters ($\Omega_1,Q_1$) and ($\Omega_2,Q2$). (R is the lower part to the left of the bifurcation point.) The crosses show these amplitudes estimated from a hexagonal array generated numerically at the corresponding control parameters. While the agreement at ($\Omega_2,Q2$) is very good, results from the analysis do not agree very closely with the calculation at ($\Omega_1,Q_1$). Since the amplitudes of the hexagonal states are larger for these parameters, it is to be expected that nonlinear terms will be important.

Finally, hexagonal arrays with a wave-number k can exist if R is real; i.e., when $$h_2^2>24h_3(h_1-2k^2+Qk) \quad (9)$$

FIG. 22B shows the (largest) amplitude R of hexagons sets of control parameters ($\Omega1,Q1$) and ($\Omega2,Q2$). The crosses amplitudes estimates from a hexagonal array generated at the corresponding control parameters. While the agreement at ($\Omega2,Q2$) is very good, results analysis do not agree very closely with the calculation at ($\Omega1,Q1$). amplitudes of the hexagonal states are larger for these parameters, expected that nonlinear terms will be important. It is possible to terms to the expansion (*) in order to get more accurate results.

FIG. 22B shows the range $\Delta k$ of wave-numbers where this inequality is satisfied. Note that $\Delta k$ is significantly smaller for ($\Omega_2,Q_2$) near the mean concentration $C_0=0.46$, than for parameters ($\Omega_1,Q_1$) near $C_0=0.30$. Thus, the characteristic domain size at $(\Omega_2,Q_2)$ is expected to be larger, and the corresponding variations of orientations expected to be smaller. As seen from FIGS. 24 and 25, this is indeed found to be the case.

REFERENCES CITED IN THE INVENTION

The following references were cited in the specification:
[1] S. O. Kim, H. H. Solak, M. P. Stoykovich, N. J. Ferrier, J. J. de Pablo, and P. F. Nealey. Nature, 424:411, 2003.
[2] W. Lu and Z. Suo. J. Mech. Phys. Solids, 49:1937, 2001.
[3] Z. Suo and W. Lu. J. Nanopart. Res., 2:333, 2000.
[4] R. van Gastel, N. C. Bartelt, P. J. Feibelman, F. Leonard, and G. L. Kellogg. Phys. Rev. B, 70:245413, 2004.
[5] R. van Gastel, R. Plass, N. C. Bartelt, and G. L. Kellogg. Phys. Rev. Lett., 91:055503, 2003.
P. Alivisatos, TOPS 40, 86 (2000).
Y. Arakawa, IEEE, J. Sel. Top. Quantum Electron. 8, 823 (2002).
P. Bhattacharya, A. D. Stiff-Roberts, S. Krishna, and S. Kennerly, Int. J. High Speed Electron. and Syst. 12, 969 (2002).
S. Bhattacharya and A. Ghosh, Phys. Rev. B 74, 184308 (2006)
Y. Chye, M. E. White, E. Johnston-Halperin, B. D. Gerardot, D. D. Awschalom, and P. M. Petroff, Phys. Rev. B 66, 201301 (2002).
S. Hu, G., Nathan, F., D. J., Hussain, Kouri, P., Sharma, G. H., Gunaratne, 2007. Journal of the Mechanics and Physics of Solids 55 (7), 1357-1384.
T. Lundstrom, W. Schoenfeld, H. Lee, and P. M. Petroff, Science 286, 2312 (1999).
W. Lu and Z. Suo, Phys. Rev. B, 65, 205418, 2002.
S. Nakamura, S. Pearton, and G. Fasol, "The Blue Laser Diode: The Complete Story." Springer, Berlin, 2000.
P. M. Petroff, Top. Appl. Phys. 90, 1 (2003).
All references cited herein are incorporated by reference. Although the invention has been disclosed with reference to its preferred embodiments, from reading this description those of skill in the art may appreciate changes and modification that may be made which do not depart from the scope and spirit of the invention as described above and claimed hereafter.

We claim:

1. An article comprising:
a substrate including:
a plurality of first lines deposited on a surface of the substrate,
a plurality of first regions defined between the plurality of first lines, and
a plurality of first self-assembled, nano-structures formed within or on the plurality of first regions,
wherein a line spacing, a line thickness, and a line height are adjusted to produce a well ordered or substantially defect free pattern of the plurality of first nano-structures having at least 90% pattern uniformity
a plurality of second lines deposited on the surface of the substrate,
a plurality of second regions defined between the plurality of second lines, and
a plurality of second self-assembled, nano-structures formed in the second regions,
wherein the plurality of second nano-structures form a second pattern that is either partially ordered or partially defect free having a pattern uniformity between about 10% and about 90%, or not well ordered or not substantially defect free, and
wherein the plurality of first lines and plurality of second lines are formed using line forming agents selected from the group consisting of Group VIII metals or metal ions to form conductive lines; metals to form semiconductor lines; materials to form insulator lines; and mixtures or combinations thereof and where the plurality of lines and plurality of second lines are composed of the same or different line forming agents.

2. The article of claim 1, wherein the plurality of first lines are parallel.

3. The article of claim 1, wherein:
the first self-assembled, nano-structures are selected from the group consisting of organic molecules, organic oligomers, and/or organic polymers capable of self assembly, biomolecular molecules, biomolecular oligomer, and/or biomolecular polymers capable of self assembly, nano-scale metal clusters, fullerenes, nano-tubes, quantum dots, nano-shells comprising a core having a thin shell coating, and mixtures or combinations thereof, and
the nano-scale metal clusters are selected from the group consisting of nano-scale clusters of pure metals or nano-scale clusters of alloys of two or more metals.

4. The article of claim 1, wherein:
the plurality of first lines are parallel and the plurality of second lines are parallel, where the plurality of second lines bear an angle to the plurality of first lines.

5. The article of claim 1, wherein the substrate further includes:
a plurality of third lines deposited on the surface of the substrate,
a plurality of third regions defined between the plurality of third lines, and
a plurality of third self-assembled, nano-structures formed in the third regions,
wherein the plurality of third nano-structures form a third pattern that is either not well ordered or not substantially defect free.

6. The article of claim 5, wherein:
the plurality of first lines are parallel lines and the plurality of second lines are parallel, where the plurality of second lines bear an angle to the plurality of first lines, and
the plurality of third lines are formed using line forming agents selected from the group consisting of Group VIII metals or metal ions to form conductive lines; metals to form semiconductor lines; materials to form insulator lines; and mixtures or combinations thereof and where the plurality of first lines and the plurality of second lines are composed of the same or different line forming agents.

7. An article comprising:
a substrate including:
a plurality of first lines deposited on a surface of the substrate,
a plurality of first regions defined between the plurality of first lines, and
a plurality of first self-assembled, nano-structures formed in the first regions,
wherein the first lines have a line spacing, a line thickness, and a line height adjusted to produce a well ordered or substantially defect free pattern of first nano-structures having at least 90% pattern uniformity, and
a plurality of second lines deposited on the surface of the substrate,
a plurality of second regions defined between the plurality of second lines, and a plurality of second self-assembled, nano-structures formed in the second regions, wherein the plurality of second nano-structures form a second pattern that is either partially ordered or partially defect free having a pattern uniformity between about 10% and about 90%, or not well ordered or not substantially defect free.

8. The article of claim 7, wherein:
the plurality of first lines are parallel and
the plurality of second lines are parallel,
wherein the plurality of second lines bear an angle to the plurality of first lines.

9. The article of claim 7, wherein:
the first and second self-assembled nano-structures are selected from the group consisting of organic molecules, organic oligomers, and/or organic polymers capable of self assembly, biomolecular molecules, biomolecular oligomer, and/or biomolecular polymers capable of self assembly, nano-scale metal clusters, fullerenes, nano-tubes, quantum dots, nano-shells comprising a core having a thin shell coating, and mixtures or combinations thereof, and
the nano-scale metal clusters are selected from the group consisting of nano-scale clusters of pure metals or nano-scale clusters of alloys of two or more metals.

10. The article of claim 7, wherein the substrate further includes:
a plurality of third lines deposited on the surface of the substrate,
a plurality of third regions defined between the plurality of third lines, and
a plurality of third self-assembled, nano-structures formed in the third regions,
wherein the plurality of third nano-structures form a third pattern that is not well ordered or not substantially defect free.

11. The article of claim 10, wherein:
the plurality of first lines are parallel,
the plurality of second lines are parallel, wherein the plurality of second lines bear an angle to the plurality of first lines.

12. An article comprising:
a substrate including:
a plurality of first lines deposited on a surface of the substrate,
a plurality of first regions defined between the plurality of first lines, and
a plurality of first self-assembled, nano-structures formed in the first regions,
wherein the first lines have a line spacing, a line thickness, and a line height adjusted to produce a well ordered or substantially defect free pattern of first nano-structures having at least 90% pattern uniformity,
a plurality of second lines deposited on the surface of the substrate,
a plurality of second regions defined between the plurality of second lines, and
a plurality of second self-assembled, nano-structures formed in the second regions,
wherein the plurality of second nano-structures form a second pattern that is either partially ordered or partially defect free having a pattern uniformity between about 10% and about 90%, or not well ordered or not substantially defect free, and
a plurality of third lines deposited on the surface of the substrate,
a plurality of third regions defined between the plurality of third lines, and
a plurality of third self-assembled, nano-structures formed in the third regions,
wherein the plurality of third nano-structures form a third pattern that is either not well ordered or not substantially defect free.

13. The article of claim 12, wherein:
the plurality of first lines parallel, and
the plurality of second lines parallel, wherein the plurality of second lines bear an angle to the plurality of first lines.

14. The article of claim 12, wherein:
the first, second, and third self-assembled nano-structures are selected from the group consisting of organic molecules, organic oligomers, and/or organic polymers capable of self assembly, biomolecular molecules, biomolecular oligomer, and/or biomolecular polymers capable of self assembly, nano-scale metal clusters, fullerenes, nano-tubes, quantum dots, nano-shells comprising a core having a thin shell coating, and mixtures or combinations thereof, and
the nano-scale metal clusters are selected from the group consisting of nano-scale clusters of pure metals or nano-scale clusters of alloys of two or more metals.

15. The article of claim 1, wherein the first lines are nano-lines.

16. An article comprising:
a substrate including:
two arrays of uniform parallel stripes oriented 60° apart defining regions between the arrays of stripes,
a plurality of self-assembled, nano-structures formed in the regions,
wherein the nano-structures form a single domain having long-range positional and orientational order and wherein the stripes have a width on the order of 20 nm and wherein a nearest neighbor distance between nano-structures is between 5 nm and 10 nm.

* * * * *